(12) United States Patent
Xu

(10) Patent No.: US 12,126,278 B2
(45) Date of Patent: Oct. 22, 2024

(54) APPARATUS AND METHOD FOR CONTROLLING INVERTER

(71) Applicant: LS ELECTRIC CO., LTD., Anyang-si (KR)

(72) Inventor: Chengde Xu, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 152 days.

(21) Appl. No.: 17/756,868

(22) PCT Filed: Mar. 16, 2020

(86) PCT No.: PCT/KR2020/003605
§ 371 (c)(1),
(2) Date: Jun. 3, 2022

(87) PCT Pub. No.: WO2021/112334
PCT Pub. Date: Jun. 10, 2021

(65) Prior Publication Data
US 2022/0416687 A1   Dec. 29, 2022

(30) Foreign Application Priority Data

Dec. 3, 2019  (KR) .................. 10-2019-0159109

(51) Int. Cl.
*H02M 1/32* (2007.01)
*H02H 7/122* (2006.01)
*H02M 7/5395* (2006.01)

(52) U.S. Cl.
CPC ........ *H02M 7/5395* (2013.01); *H02H 7/1227* (2013.01); *H02M 1/32* (2013.01)

(58) Field of Classification Search
CPC ...... H02M 1/32; H02M 7/5395; H02M 7/537; H02M 7/5387; H02M 7/53875; H02P 27/08; H02P 27/085
See application file for complete search history.

(56) References Cited

U.S. PATENT DOCUMENTS

2013/0257332 A1* 10/2013 Nakano ............... H02P 29/0241
                                                                    318/490
2021/0067069 A1*  3/2021 Iezawa ...................... H02P 6/28

FOREIGN PATENT DOCUMENTS

| JP | 2007231674 A | 9/2007 |
| JP | 2011188653 A | 9/2011 |
| JP | 2018161042 A | 10/2018 |
| KR | 1020120060066 A | 6/2012 |

(Continued)

OTHER PUBLICATIONS

Office Action for related Japanese Application No. 2022-532612; action dated Jun. 7, 2023; (2 pages).

(Continued)

*Primary Examiner* — Alex Torres-Rivera
(74) *Attorney, Agent, or Firm* — K&L Gates LLP

(57) ABSTRACT

An apparatus and a method for controlling an inverter are disclosed. A method, according to one embodiment of the present disclosure, receives an operation command for an inverter, outputs a first PWM control signal, to an inverter unit, such that the inverter unit outputs at least one among a plurality of valid vectors for the diagnosis of a short circuit of the output of the inverter, and blocks the output of the inverter if a short circuit current of the inverter is detected.

10 Claims, 30 Drawing Sheets

(a)

(b)

(56) References Cited

FOREIGN PATENT DOCUMENTS

KR   1020180020919 A   2/2018
WO     2009072460 A1   6/2009

OTHER PUBLICATIONS

International Search Report for related International Application No. PCT/KR2020/003605; report dated Jun. 10, 2021; (7 pages).
Written Opinion for related International Application No. PCT/KR2020/003605; report dated Jun. 10, 2021; (8 pages).
Office Action for related Chinese Application No. 202080082718.3; action dated Aug. 30, 2024; (8 pages).

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

APPARATUS AND METHOD FOR CONTROLLING INVERTER

CROSS-REFERENCE TO RELATED APPLICATION

This application is a National Stage of International Application No. PCT/KR2020/003605 filed on Mar. 16, 2020, claims priority to and the benefit of Korean Patent Application No. 10-2019-0159109, filed on Dec. 3, 2019, the disclosure of which is incorporated herein by reference in its entirety.

FIELD

The present disclosure relates to an inverter control apparatus and method.

BACKGROUND

In general, an inverter is an inverse-conversion device that electrically converts a direct current (DC) into an alternating current (AC), and an inverter used in the industry is defined as a series of devices that receive power supplied from a commercial power source, change a voltage and a frequency by itself, and supply the voltage and the frequency to an electric motor, thereby controlling a speed of the electric motor to be used at high efficiency. Such an inverter is controlled by the variable voltage variable frequency (VVVF) method, and it may change a voltage and a frequency input to the electric motor according to a pulse width modulation (PWM) output.

FIG. 1 is a configuration diagram of a general inverter.

In general, an inverter 100 receives three-phase AC power from a power supply unit 200, and a rectifying unit 110 rectifies the three-phase AC power, and a smoothing unit 120 smoothes and stores a DC voltage rectified by the rectifying unit 110. An inverter unit 130 outputs a DC voltage stored in a DC link capacitor, which is the smoothing unit 120, and an AC voltage having a predetermined voltage and a predetermined frequency according to a PWM control signal, and provides the same to an electric motor 300.

In this case, the inverter unit 130 of the inverter 100 is composed of three-phase legs, and two switching elements are connected in series in each leg.

A short circuit of the inverter 100 is a case in which two or more phases in the output of the inverter 100 are short-circuited to each other, and thus, a very large short-circuit current flows into the inverter 100, and it is generated as a coating is peeled off due to the deterioration of an output line coating of the inverter 100, is generated as a coating inside the electric motor 300 is peeled off due to deterioration, or is generated by an error of an operator.

When the inverter 100 is short-circuited, since a current flowing to the inverter 100 reaches several times or more of a rated value, there is a possibility that the inverter 100 may be dissipated, and there is a possibility that even a life-threatening accident may occur.

Accordingly, the inverter 100 that operates the electric motor 300 provides a function of notifying the user when an output short circuit occurs and a function of stopping the operation of the inverter 100, thereby safely protecting the electric motor 300 and the user.

However, such a short-circuit detection circuit has a hardware circuit delay period, and when the magnitude of an effective vector is small, there is a problem in that an output short circuit is not detected due to such a delay.

SUMMARY

The technical problem to be solved by the present disclosure is to provide an inverter control apparatus and method for stably operating an inverter by diagnosing a short circuit before driving the inverter.

In order to solve the technical problem as above, the control apparatus for controlling an inverter according to an exemplary embodiment of the present disclosure may include an inverter unit composed of a plurality of switching elements to convert a DC voltage into an AC voltage under the control of a control unit and output; a short-circuit detection unit for detecting a short-circuit current flowing through the inverter unit; and the control unit for applying a pulse width modulation (PWM) control signal to the inverter unit such that the inverter unit outputs at least one of a plurality of effective vectors for diagnosing a short circuit in the output of the inverter.

In an exemplary embodiment of the present disclosure, the inverter unit may be composed of three-phase legs that outputs a three-phase AC voltage, and the short-circuit detection unit may detect a short-circuit current flowing to a lower leg of the three-phase leg.

In an exemplary embodiment of the present disclosure, the PWN control signal may include a signal that causes the inverter unit to output any one of [1 0 0], [0 1 0], [0 1 1] and [1 0 1], which are the effective vectors, in response to a short circuit of U-V phases.

In an exemplary embodiment of the present disclosure, the PWN control signal may include a signal that causes the inverter unit to output any one or more of [1 1 0], [0 1 0], [0 0 1] and [1 0 1], which are the effective vectors, in response to a short circuit of V-W phases.

In an exemplary embodiment of the present disclosure, the PWN control signal may include a signal that causes the inverter unit to output any one or more of [1 0 0], [1 1 0], [0 1 1] and [0 0 1], which are the effective vectors, in response to a short circuit of W-U phases.

In an exemplary embodiment of the present disclosure, the control unit may output the PWM control signal such that the inverter unit outputs at least one of the plurality of effective vectors for a predetermined time or longer.

In an exemplary embodiment of the present disclosure, the predetermined time may be determined from the circuit characteristics of the short-circuit detection unit.

In addition, in order to solve the technical problem as above, the method for controlling an inverter including an inverter unit that is composed of a plurality of switching elements to convert a DC voltage into an AC voltage and output according to an exemplary embodiment of the present disclosure may include the steps of receiving an operation command of the inverter; outputting a first PWM control signal to the inverter unit to output at least one of a plurality of effective vectors for diagnosing a short circuit in the output of the inverter; and blocking the output of the inverter when a short-circuit current of the inverter unit is detected.

In an exemplary embodiment of the present disclosure, the first PWN control signal may include a signal that causes the inverter unit to output any one of [1 0 0], [0 1 0], [0 1 1] and [1 0 1], which are the effective vectors, in response to a short circuit of U-V phases.

In an exemplary embodiment of the present disclosure, the first PWN control signal may include a signal that causes the inverter unit to output any one or more of [1 1 0], [0 1

0], [0 0 1] and [1 0 1], which are the effective vectors, in response to a short circuit of V-W phases.

In an exemplary embodiment of the present disclosure, the first PWN control signal may include a signal that causes the inverter unit to output any one or more of [1 0 0], [1 1 0], [0 1 1] and [0 0 1], which are the effective vectors, in response to a short circuit of W-U phases.

In an exemplary embodiment of the present disclosure, the first PWM control signal may cause the inverter unit to output at least one of the plurality of effective vectors for a predetermined time or longer.

In an exemplary embodiment of the present disclosure, the predetermined time may be determined from the circuit characteristics of the short-circuit detection unit.

The method according to an exemplary embodiment of the present disclosure may further include outputting a second PWN control signal for normal operation of the inverter, when a short-circuit current of the inverter unit is not detected.

When a short circuit occurs and an operation command is received from an inverter, the present disclosure as described above has the effects of protecting the inverter and protecting the operator by performing a short circuit diagnosis by the diagnostic PWM control signal to block the output of the inverter in advance.

DETAILED DESCRIPTION

In order to fully understand the configuration and effects of the present disclosure, preferred exemplary embodiments of the present disclosure will be described with reference to the accompanying drawings. However, the present disclosure is not limited to the exemplary embodiments disclosed below and may be embodied in various forms, and various modifications may be made. However, the description of the present exemplary embodiment is provided so that the disclosure of the present disclosure is complete, and to fully inform the scope of the disclosure to those of ordinary skill in the art to which the present disclosure pertains. In the accompanying drawings, components are illustrated by enlarging in size than actual for the convenience of description, and the ratios of each component may be exaggerated or reduced.

Terms such as 'first' and 'second' may be used to describe various components, but the components should not be limited by the above terms. The above terms may be used only for the purpose of distinguishing one component from another. For example, without departing from the scope of the present disclosure, a 'first component' may be termed a 'second component', and similarly, a 'second component' may also be termed a 'first component'. In addition, the singular expression includes the plural expression unless the context clearly dictates otherwise. Unless otherwise defined, terms used in the exemplary embodiments of the present disclosure may be interpreted as meanings commonly known to those of ordinary skill in the art.

Hereinafter, a conventional inverter output short circuit method will be described with reference to the drawings, and the inverter control apparatus according to an exemplary embodiment of the present disclosure will be described.

Figure 1:
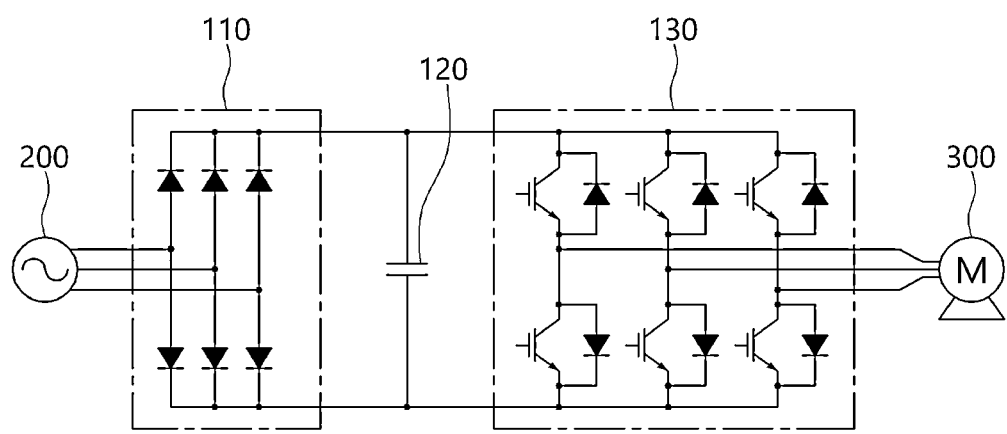
FIG. 1 is a configuration diagram of a general inverter.
Figure 2:
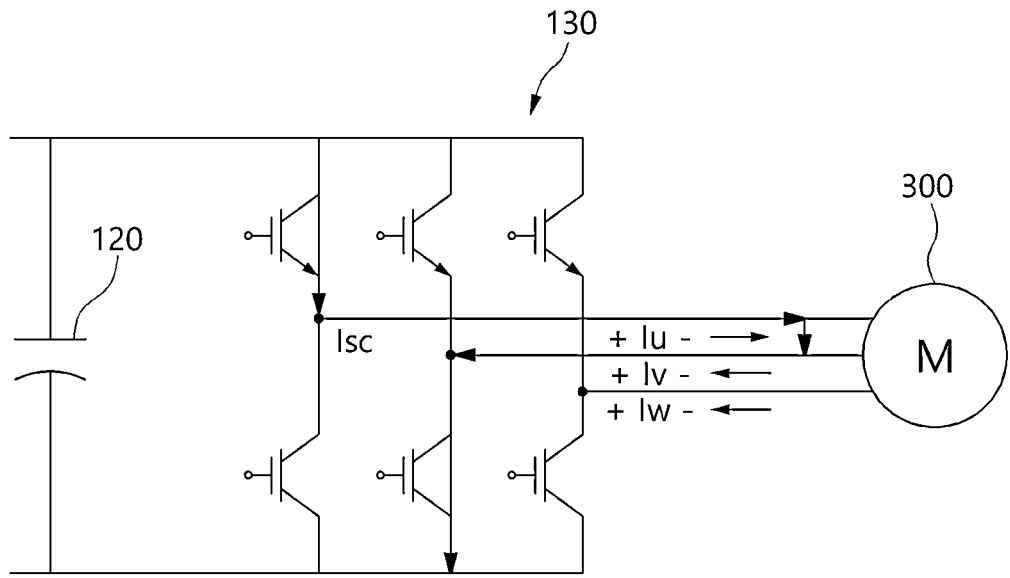
FIG. 2 shows a current path when a U phase and a V phase are short-circuited in the output of an inverter.
Figure 2:
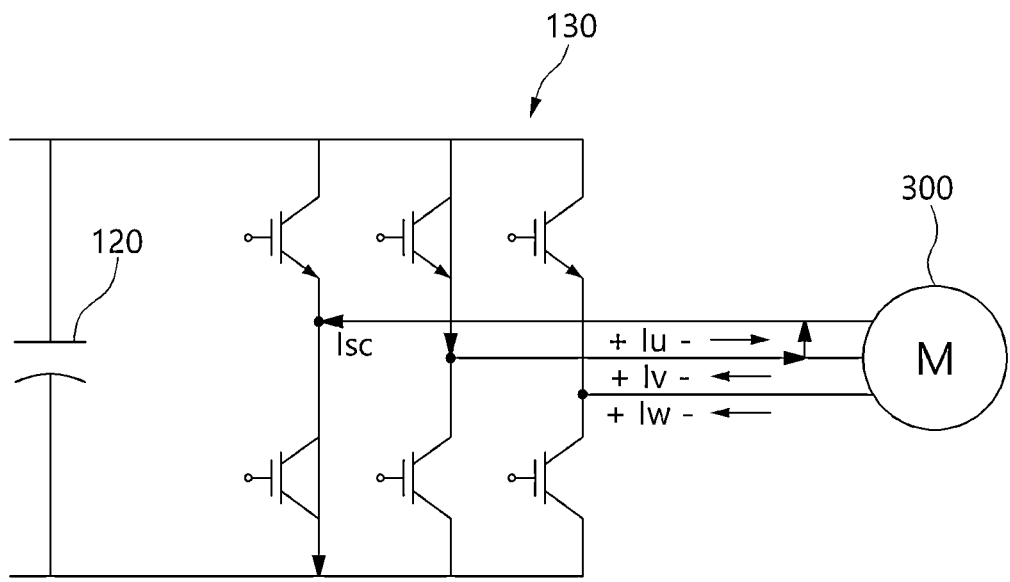
Figure 3:
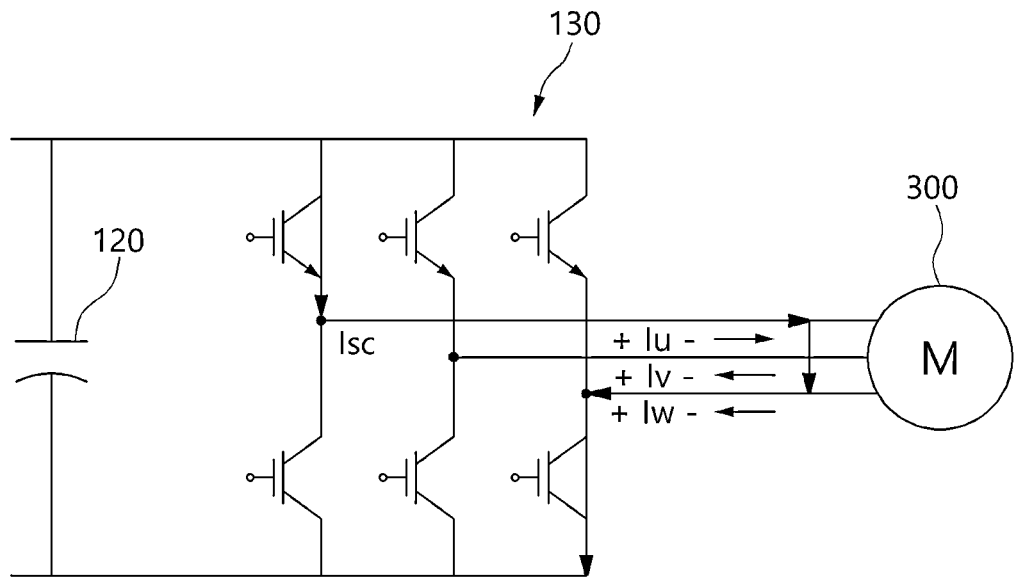
FIG. 3 shows a current path when a U phase and a W phase are short-circuited in the output of an inverter.
Figure 3:
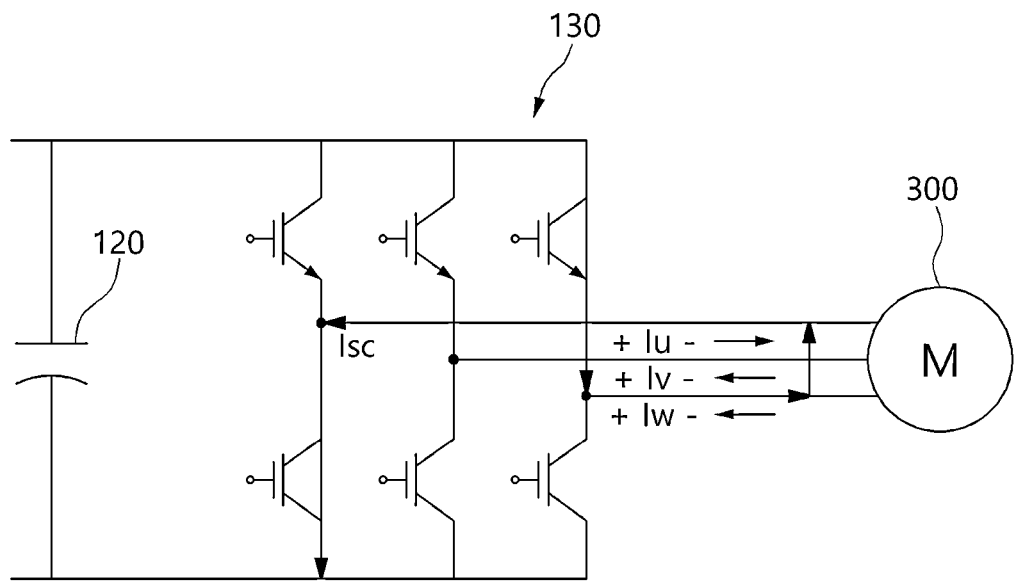
Figure 4:
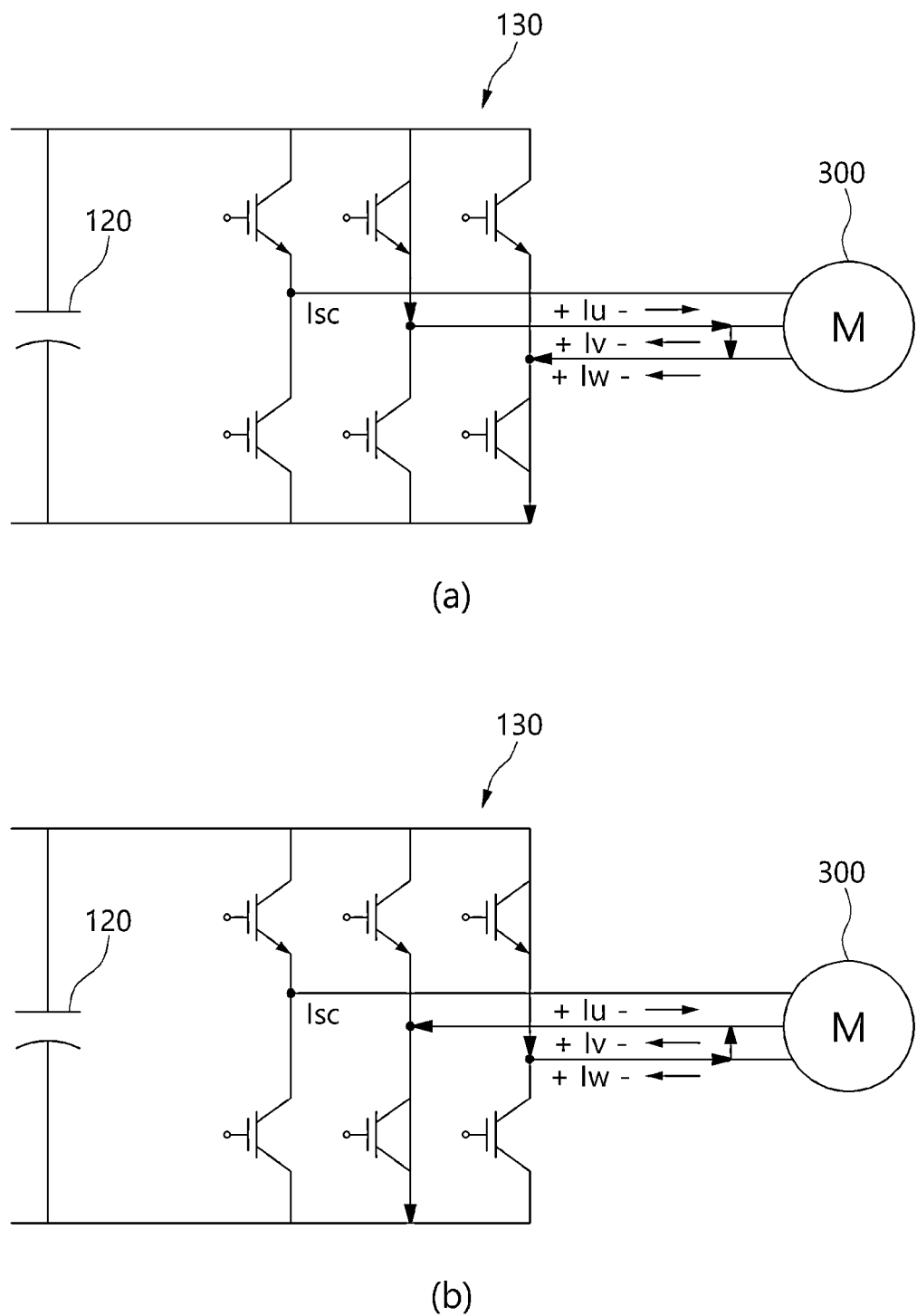
FIG. 4 shows a current path when a V phase and a W phase are short-circuited in the output of an inverter.

FIG. 2 shows a current path when a U phase and a V phase are short-circuited in the output of an inverter, FIG. 3 shows a current path when a U phase and a W phase are short-circuited in the output of an inverter, and FIG. 4 shows a current path when a V phase and a W phase are short-circuited in the output of an inverter.

That is, as shown in FIGS. 2 to 4, when the inverter output is 'short-circuited', it means that a 'short-circuit current' flows, which means a situation in which the upper and lower switches of the inverter unit 130 are turned on together.

Figure 5:
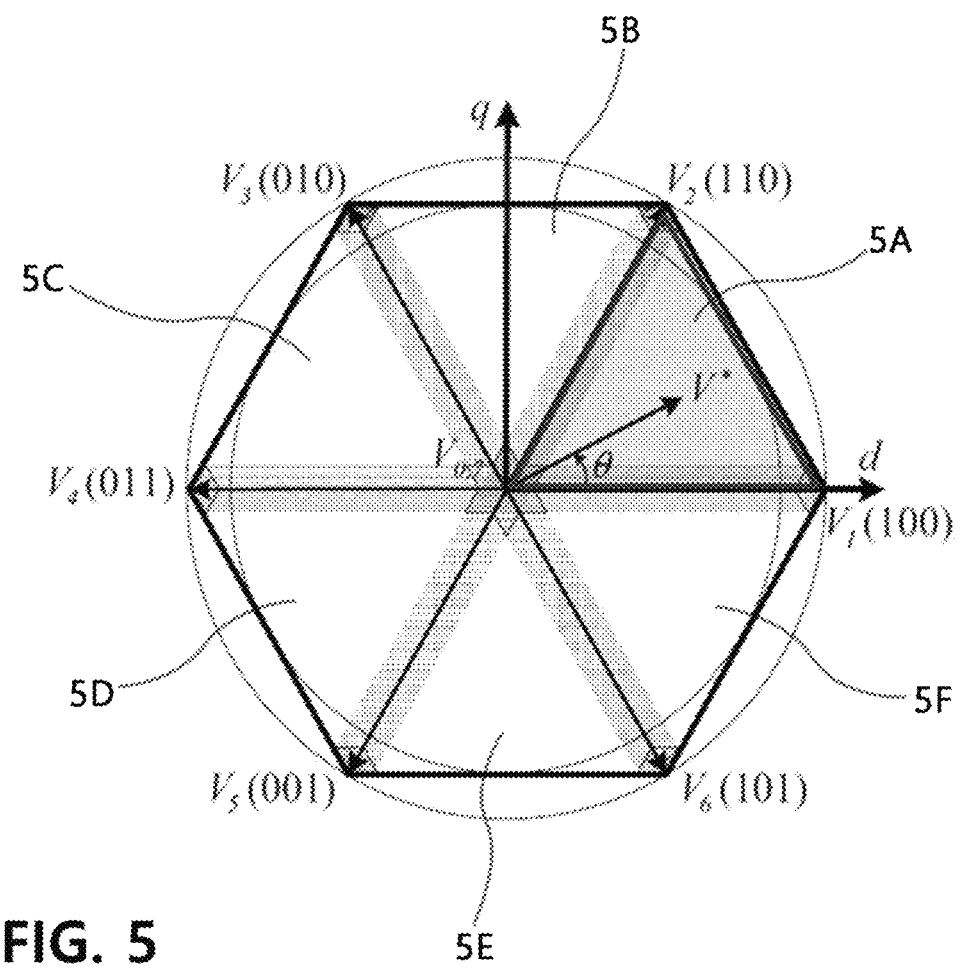
FIG. 5 is an exemplary diagram for describing the spatial vector pulse width modulation (SVPWM) of an inverter.
Figure 6:
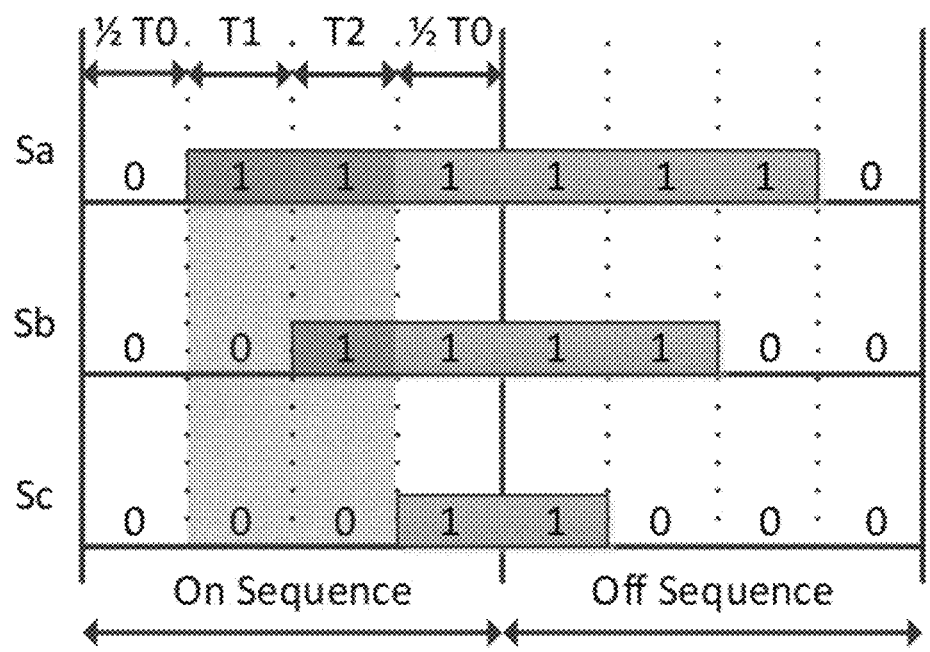
FIG. 6 is an exemplary diagram showing an effective vector in sector 1 of FIG. 5.

FIG. 5 is an exemplary diagram for describing the spatial vector pulse width modulation (SVPWM) of an inverter, and FIG. 6 is an exemplary diagram showing an effective vector in sector 1 of FIG. 5.

Figure 7:
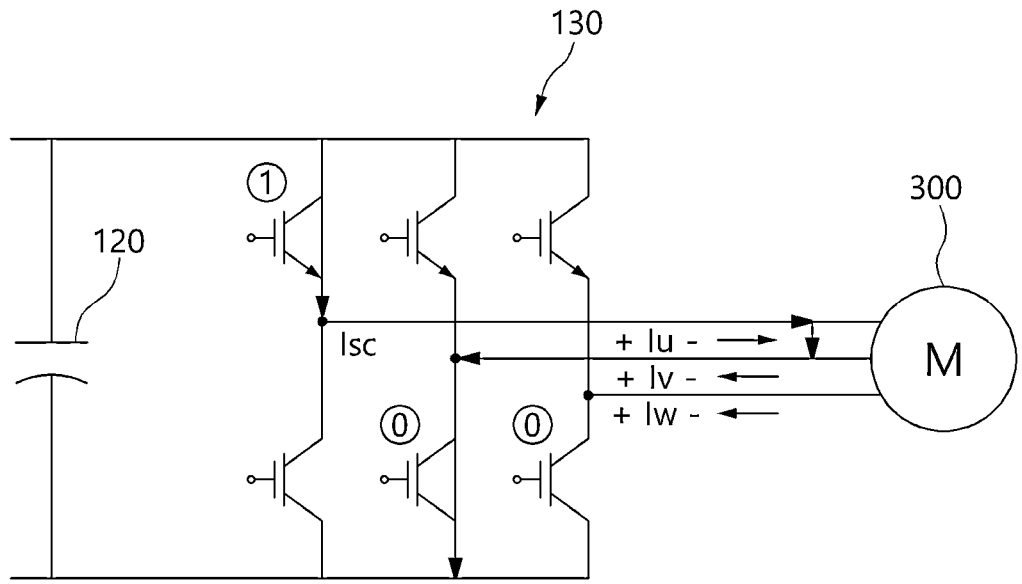
FIG. 7 is an exemplary diagram showing a current path in the case of an output short circuit of U-V phases in sector 1.
Figure 7:
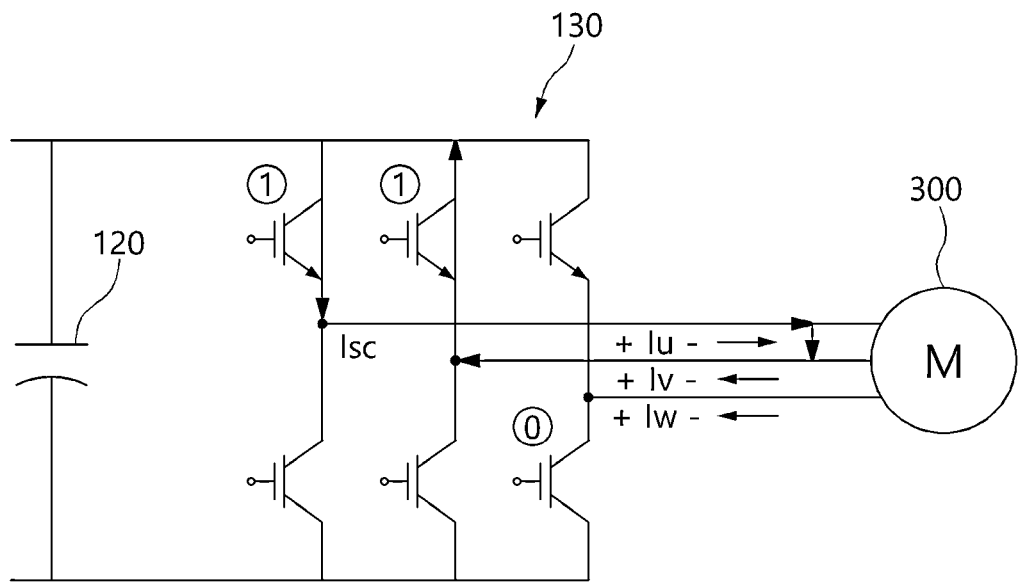
Figure 8:
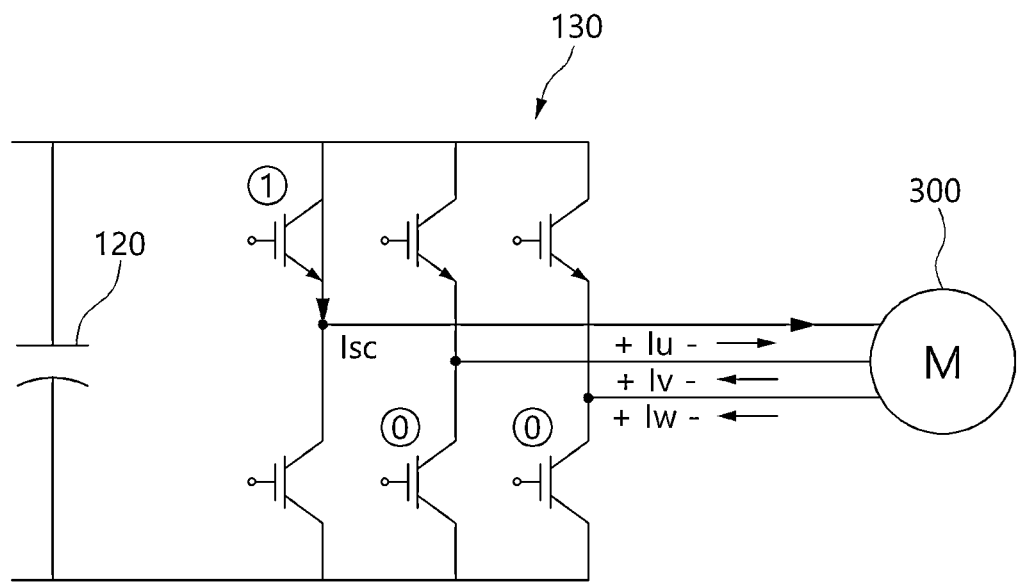
FIG. 8 is an exemplary diagram showing a current path in the case of an output short circuit of V-W phases in sector 1.
Figure 8:
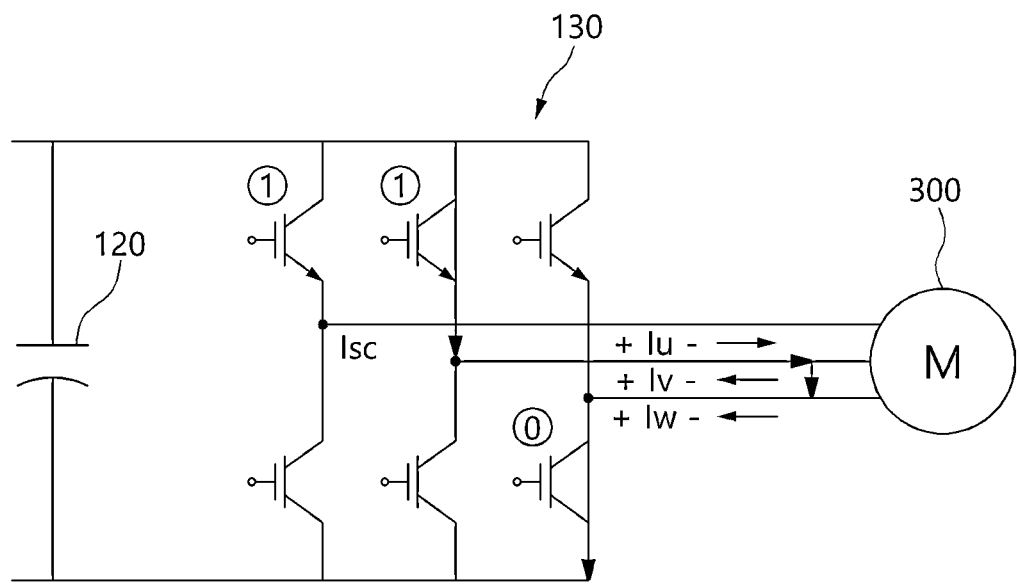
Figure 9:
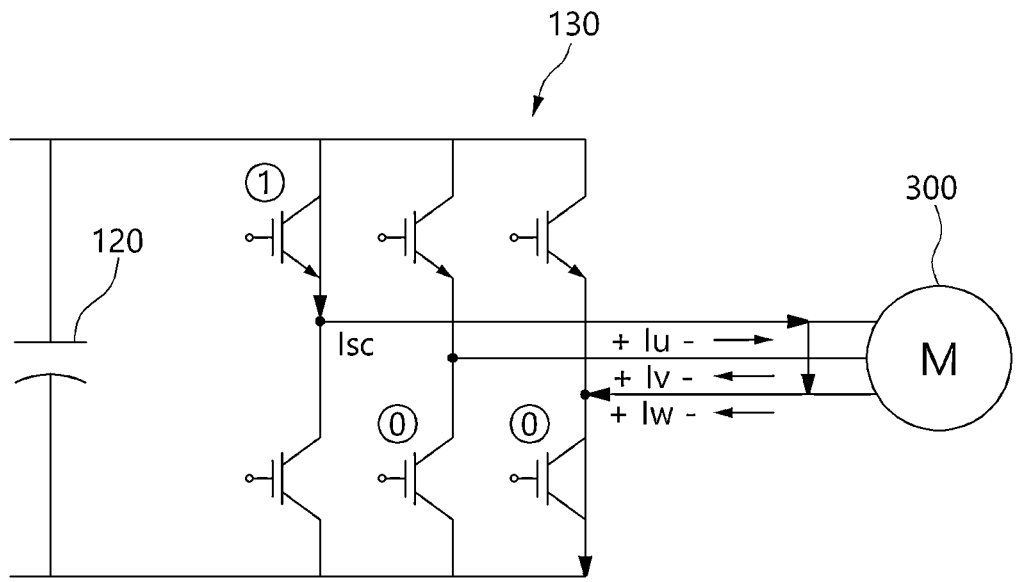
FIG. 9 is an exemplary diagram showing a current path in the case of an output short circuit of W-U phases in sector 1.
Figure 9:
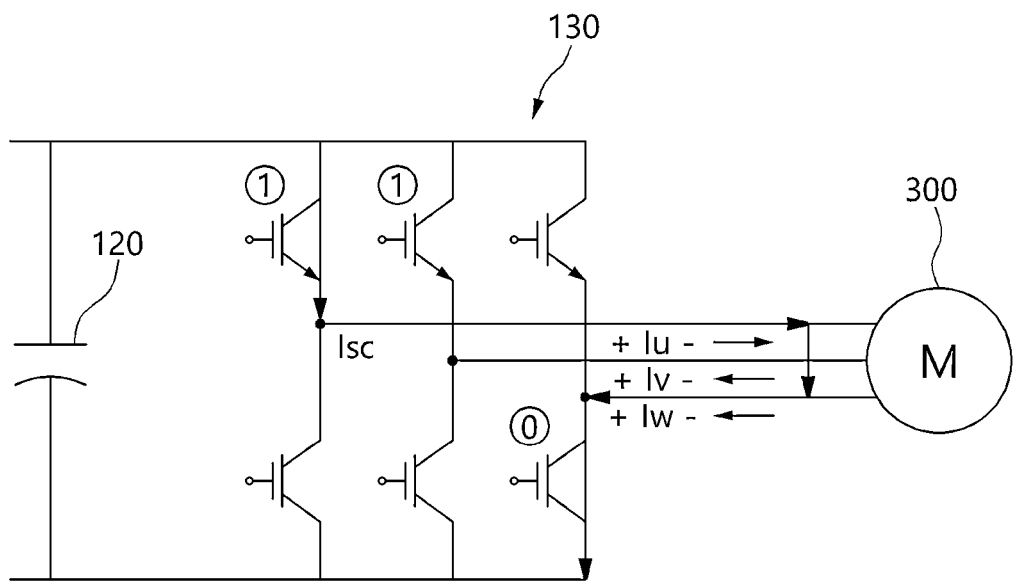

In addition, FIG. 7 is an exemplary diagram for describing a current path in the case of an output short circuit of U-V phases in sector 1, FIG. 8 is an exemplary diagram for describing a current path in the case of an output short circuit of V-W phases in sector 1, and FIG. 9 is an exemplary diagram for describing a current path in the case of an output short circuit of W-U phases in sector 1.

In general, SVPWM performs modulation by synthesizing two effective vectors adjacent to a command voltage and zero voltage on average during one cycle. The shaded portion in FIG. 5 is sector 1 (5A), and effective vectors in sector 1 (5A) are [1 0 0] and [1 1 0].

As described above, in sector 1 (5A), when the outputs of the U phase and the V phase are short-circuited, a short-circuit current flows in the effective vector [1 0 0], and the current path in this case is as shown in (a) of FIG. 7. In this case, in the case of the effective vector [1 1 0], the current flows as shown in (b) of FIG. 7. In this case, since there is no potential difference, the short-circuit current does not flow. That is, when the outputs of the U phase and the V phase in sector 1 are short-circuited, the short-circuit current flows only when the effective vector is [1 0 0].

Meanwhile, when the outputs of the V phase and W phase are short-circuited in sector 1 (5A), a short-circuit current flows in the effective vector [1 1 0], and the current path in this case is as shown in (b) of FIG. 8. When the effective vector is [1 0 0], the short-circuit current does not flow as shown in (a) of FIG. 8. That is, when the outputs of the V phase and the W phase in sector 1 are short-circuited, the short-circuit current flows only when the effective vector is [1 1 0].

In addition, when the outputs of the W phase and U phase are short-circuited in sector 1 (5A), a short-circuit current flows in both of the effective vectors [1 0 0] and [1 1 0], and the current paths in this case are shown in (a) and (b) of FIG. 9. That is, when the outputs of the W phase and U phase in sector 1 are short-circuited, the short-circuit current flows in both of the effective vectors [1 0 0] and [1 1 0].

Similarly, in sector 2 (5B) of FIG. 5, effective vectors are [1 1 0] and [0 1 0].

Figure 10:
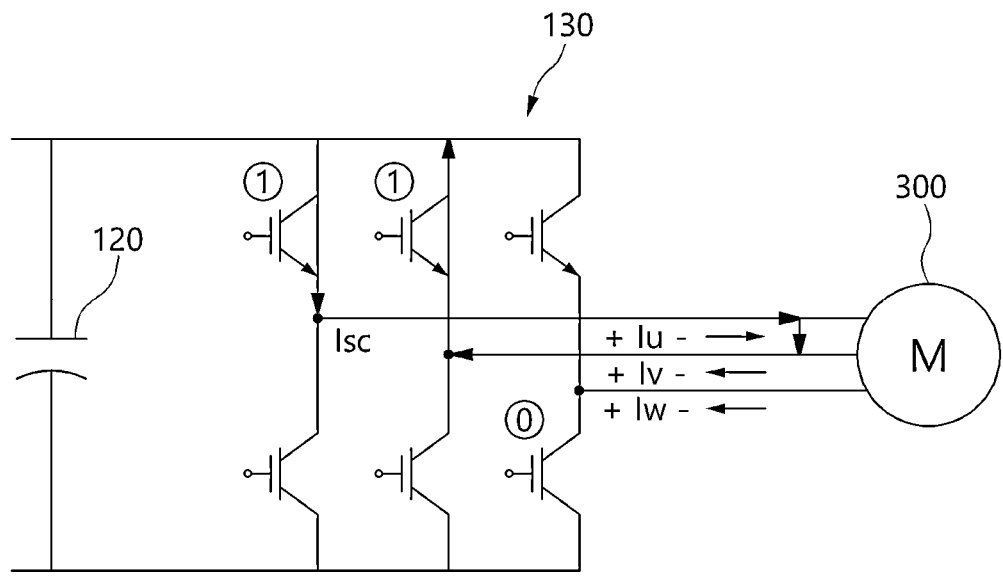
FIG. 10 is an exemplary diagram showing a current path in the case of an output short circuit of U-V phases in sector 2.
Figure 10:
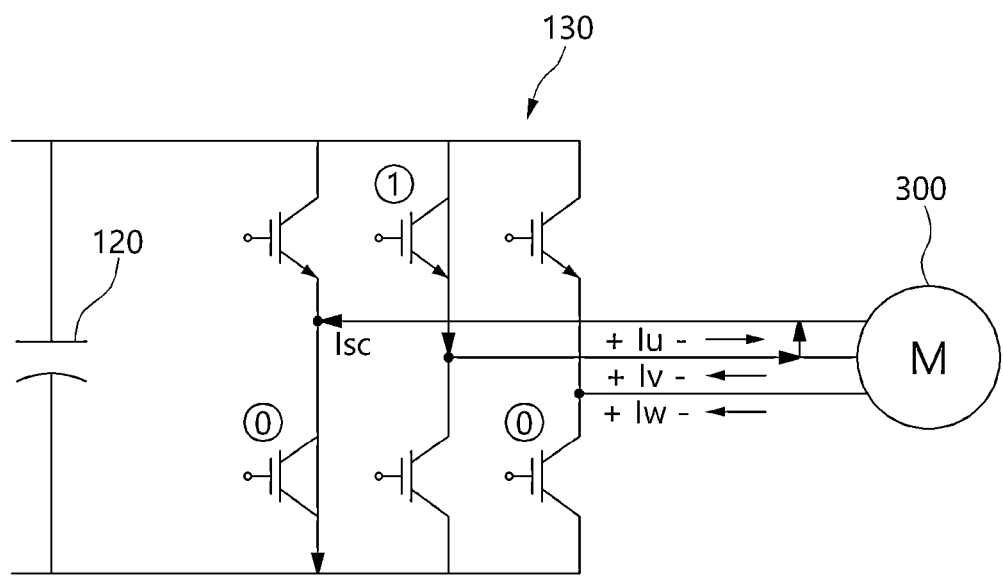
Figure 11:
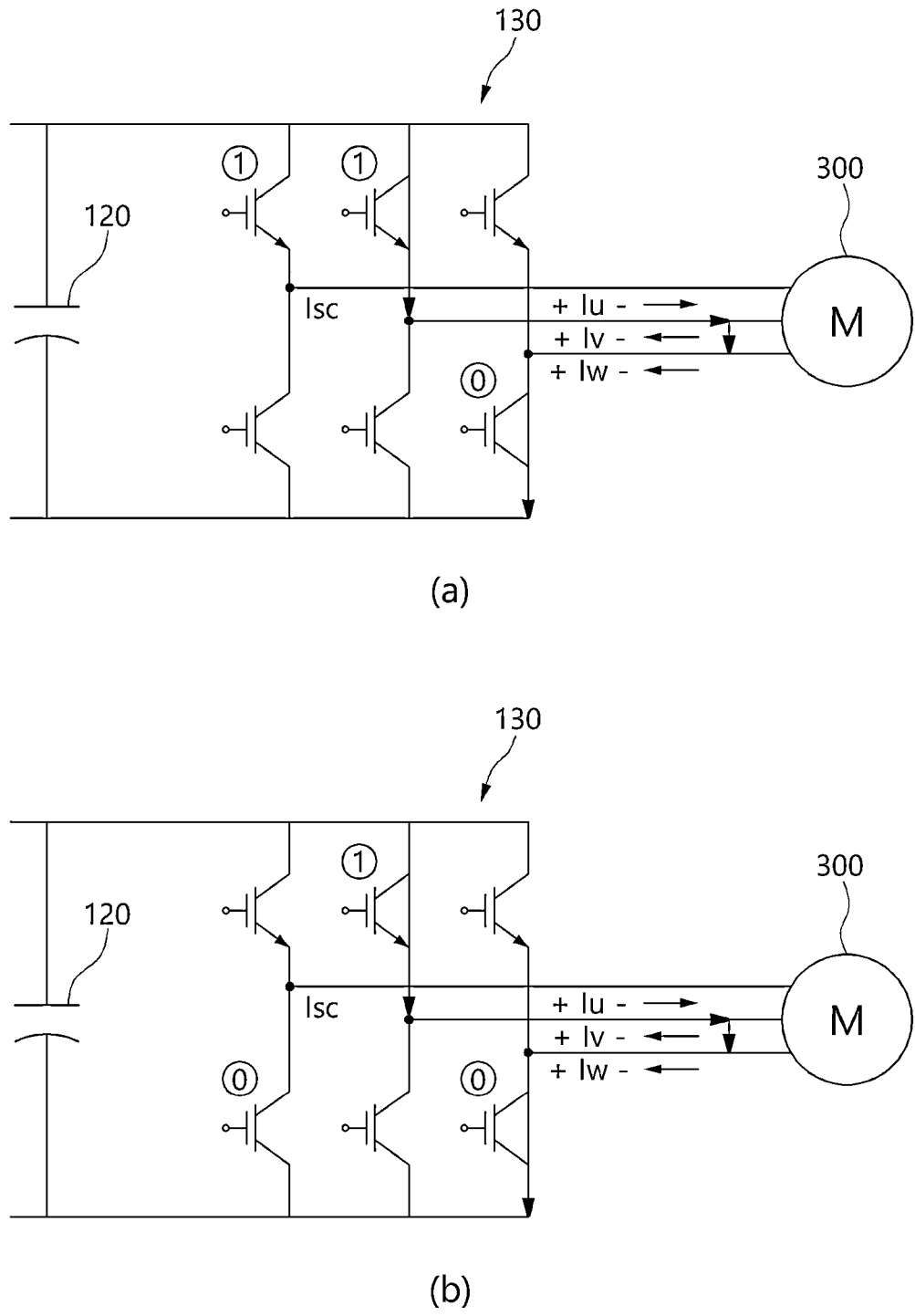
FIG. 11 is an exemplary diagram for describing a current path when the outputs of a V phase and a W phase are short-circuited in sector 2.
Figure 12:
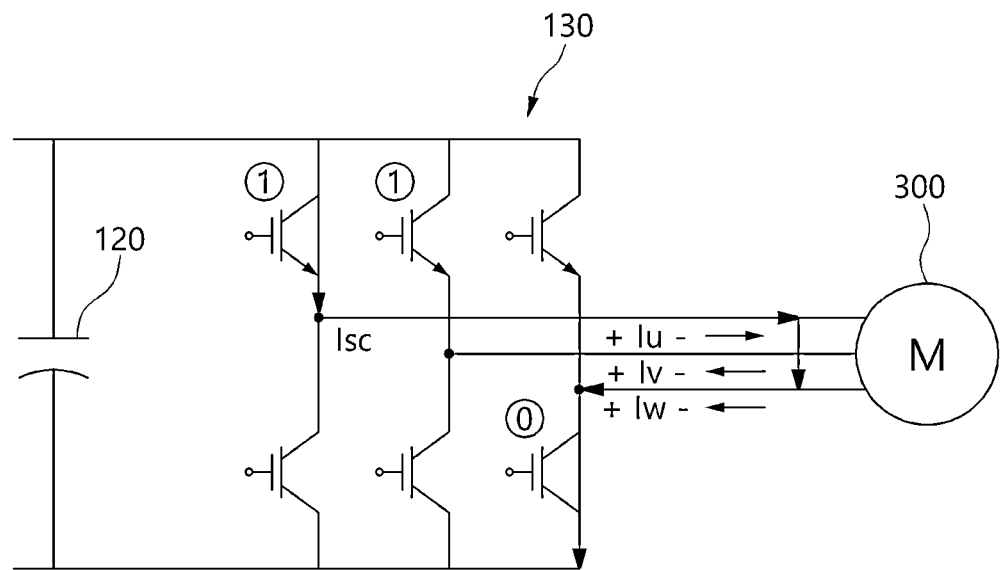
FIG. 12 is an exemplary diagram showing a current path in the case of an output short circuit of W-U phases in sector 2.
Figure 12:
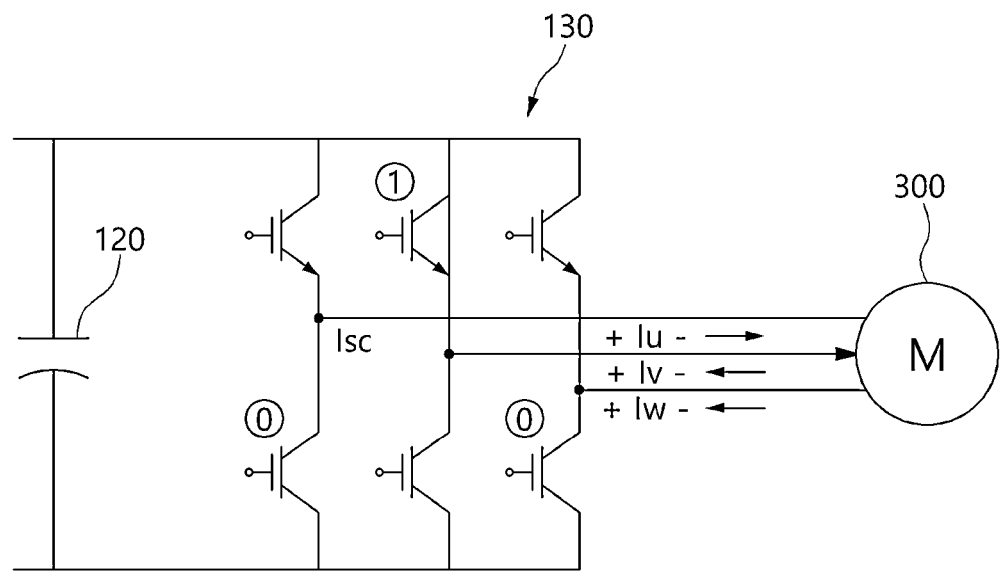

FIG. 10 is an exemplary diagram for describing a current path in the case of an output short circuit of U-V phases in sector 2, FIG. 11 is an exemplary diagram for describing a current path when the outputs of a V phase and a W phase are short-circuited in sector 2, and FIG. 12 is an exemplary diagram for describing a current path when the outputs of a W phase and a U phase are short-circuited in sector 2.

As illustrated in FIG. 10, when the outputs of the U phase and the V phase are short-circuited in sector 2 (5B), a short-circuit current flows in the effective vector [0 1 0] (refer to (b)), and since there is no potential difference in the effective vector [1 1 0], no short-circuit current flows (refer to (a)).

As illustrated in FIG. 11, when the outputs of the V phase and the W phase are short-circuited in sector 2 (5B), a short-circuit current flows in both of the effective vectors [1 1 0] and [0 1 0].

In addition, as illustrated in FIG. 12, when the outputs of the W phase and the U phase are short-circuited in sector 2 (5B), a short-circuit current flows in the effective vector [1 1 0] (refer to (a)), and no short-circuit current flows in the effective vector [0 1 0] (refer to (b)).

In sector 3 (5C) of FIG. 5, effective vectors are [0 1 0] and [0 1 1].

Figure 13:
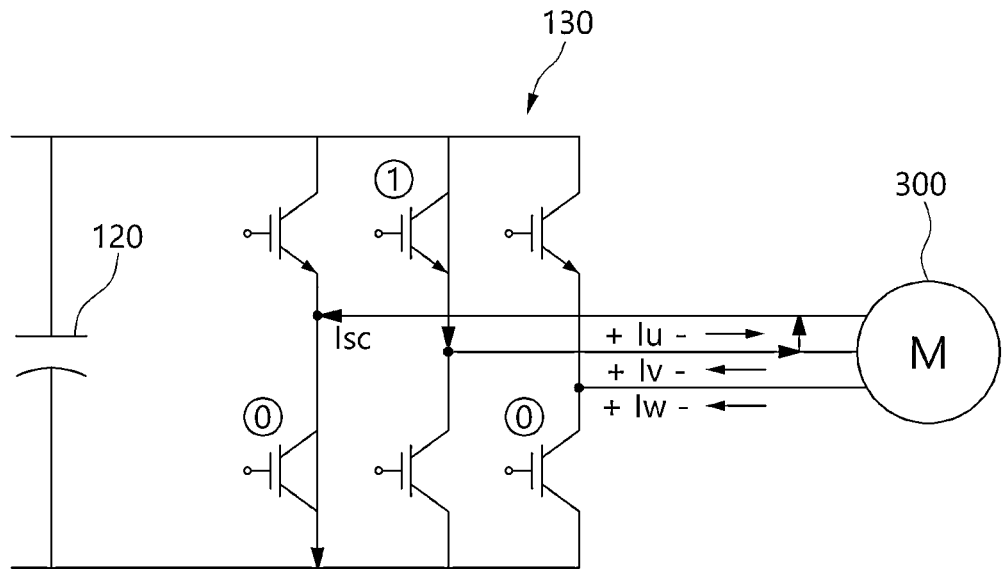
FIG. 13 is an exemplary diagram showing a current path in the case of an output short circuit of U-V phases in sector 3.
Figure 13:
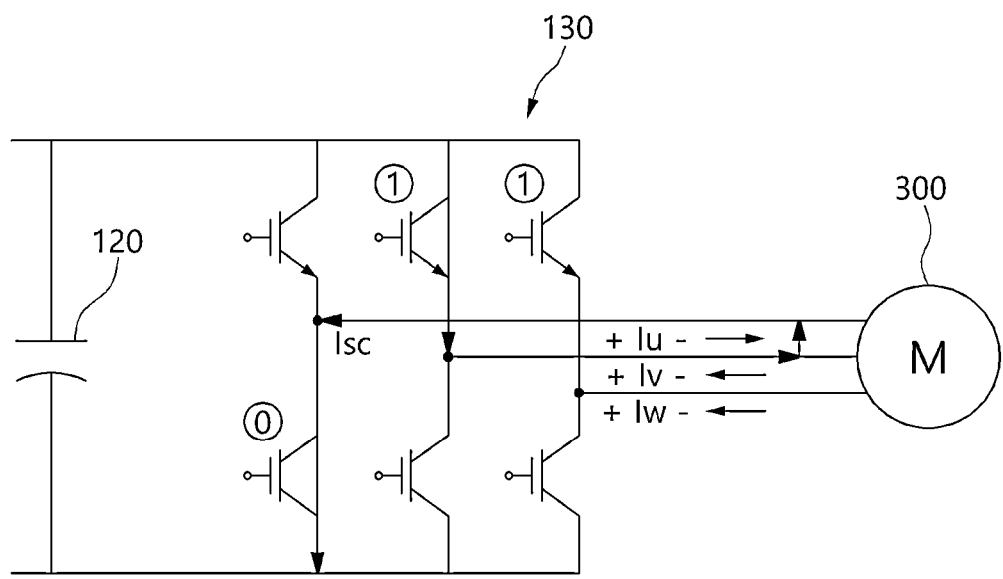
Figure 14:
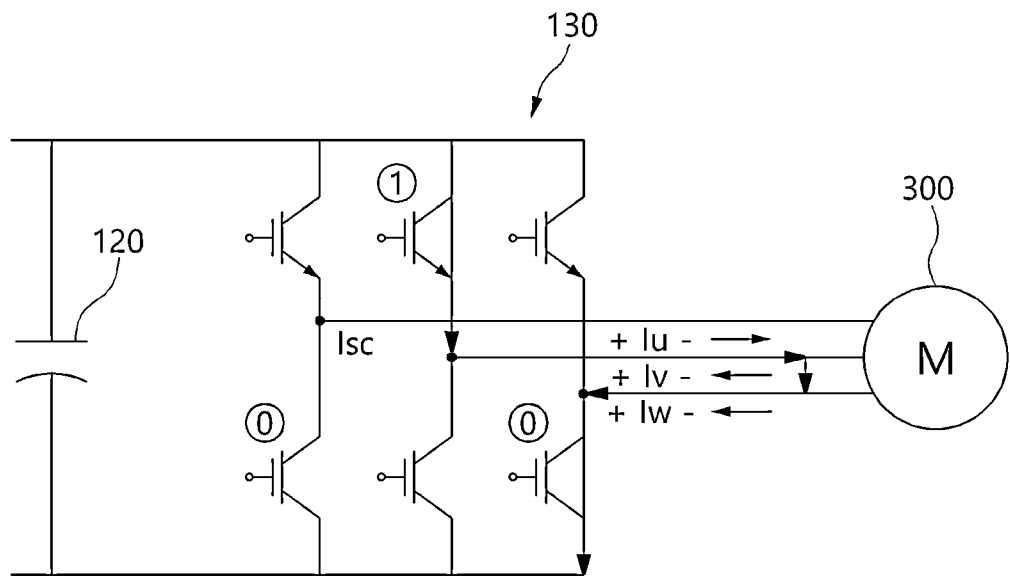
FIG. 14 is an exemplary diagram showing a current path in the case of an output short circuit of V-W phases in sector 3.
Figure 14:
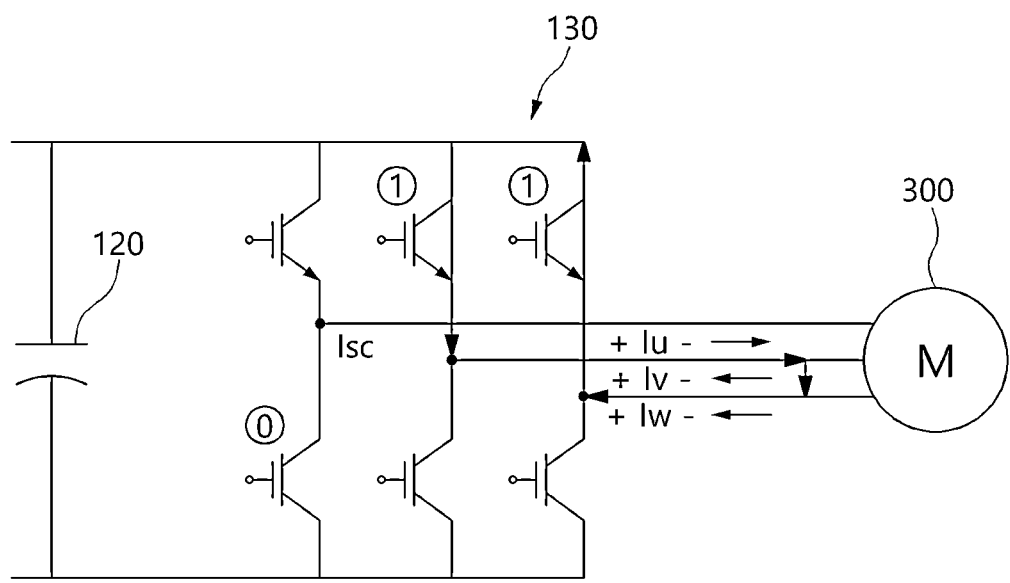
Figure 15:
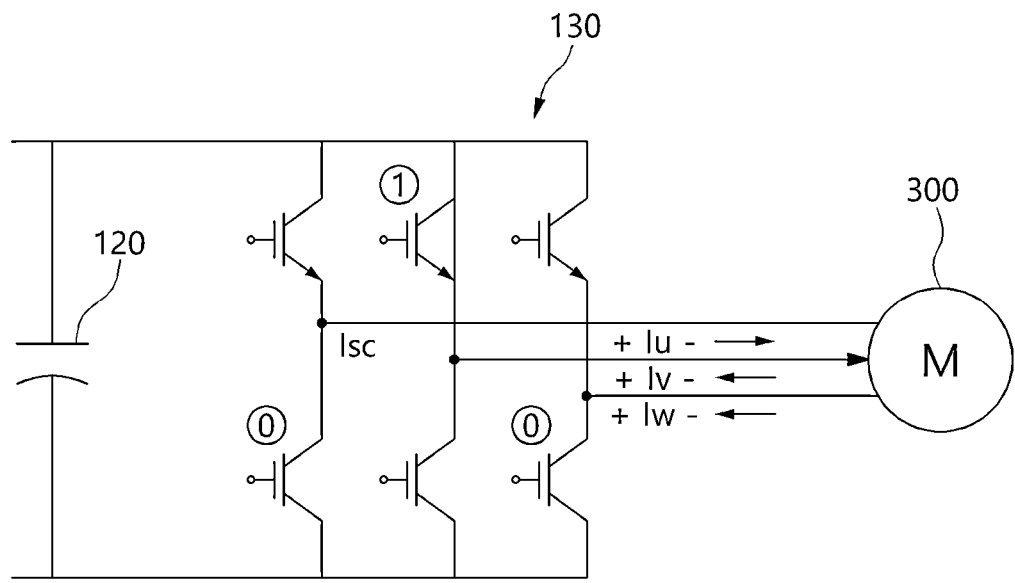
FIG. 15 is an exemplary diagram showing a current path in the case of an output short circuit of W-U phases in sector 3.
Figure 15:
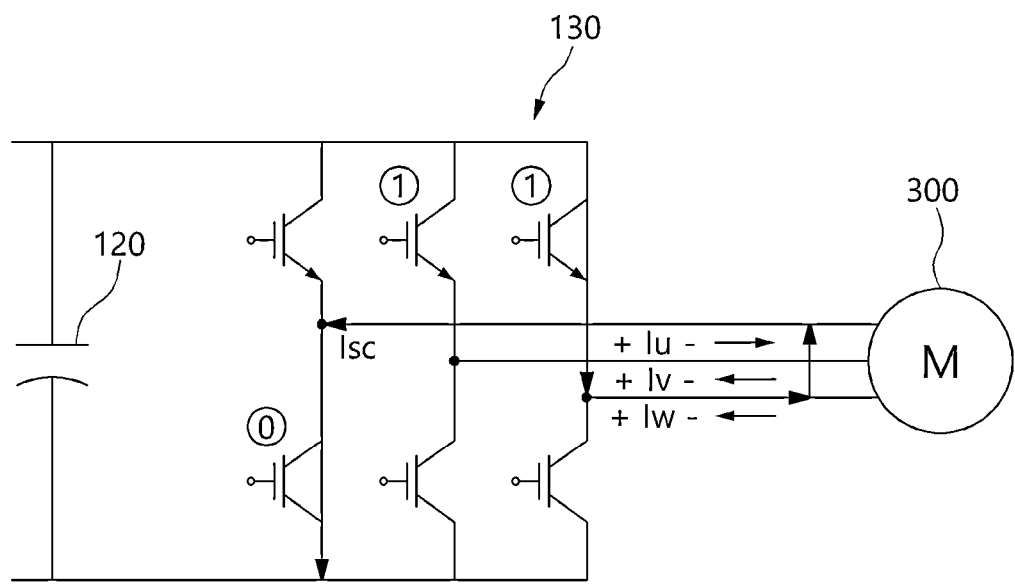

FIG. 13 is an exemplary diagram for describing a current path when the outputs of a U phase and a V phase are short-circuited in sector 3, FIG. 14 is an exemplary diagram for describing a current path when the outputs of a V phase and a W phase are short-circuited in sector 3, and FIG. 15 is an exemplary diagram for describing a current path when the outputs of a W phase and a U phase are short-circuited in sector 3.

As illustrated in FIG. 13, when the outputs of the U phase and the V phase are short-circuited in sector 3 (5C), a short-circuit current flows in the effective vector [0 1 0] (refer to (a)), and a short-circuit current also flows in the effective vector [0 1 1] (refer to (b)).

As illustrated in FIG. 14, when the outputs of the V phase and the W phase are short-circuited in sector 3 (5C), a short-circuit current flows in the effective vector [0 1 0] (refer to (a)), and since there is no potential difference in the effective vector [0 1 1], no short-circuit current flows (refer to (b)).

In addition, as illustrated in FIG. 15, when the outputs of the W phase and the U phase are short-circuited in sector 3 (5C), a short-circuit current flows in the effective vector [0 1 1] (refer to (b)), and no short-circuit current flows in the effective vector [0 1 0] (refer to (a)).

In sector 4 (5D) of FIG. 5, effective vectors are [0 1 1] and [0 0 1].

Figure 16:
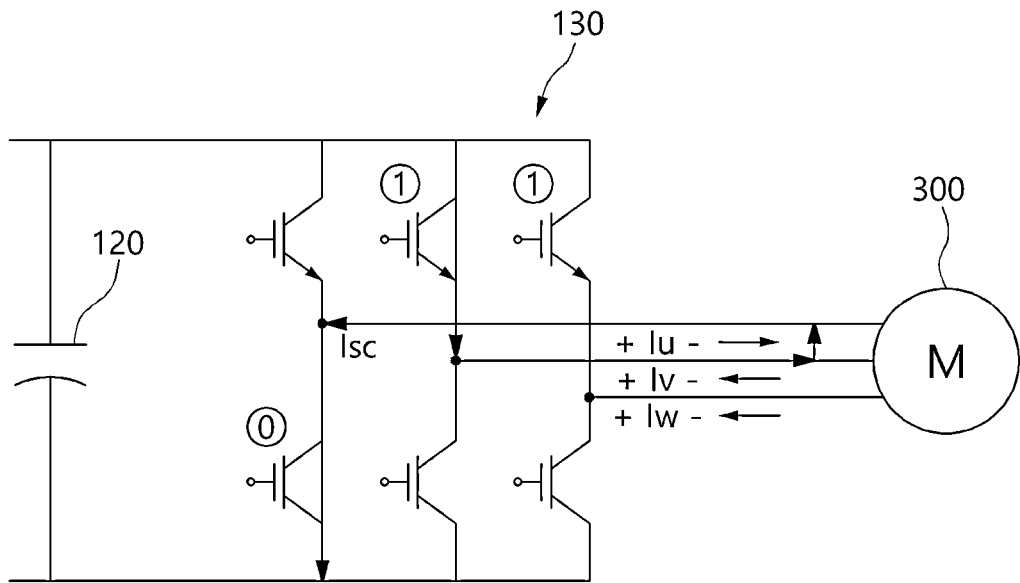
FIG. 16 is an exemplary diagram showing a current path in the case of an output short circuit of U-V phases in sector 4.
Figure 16:
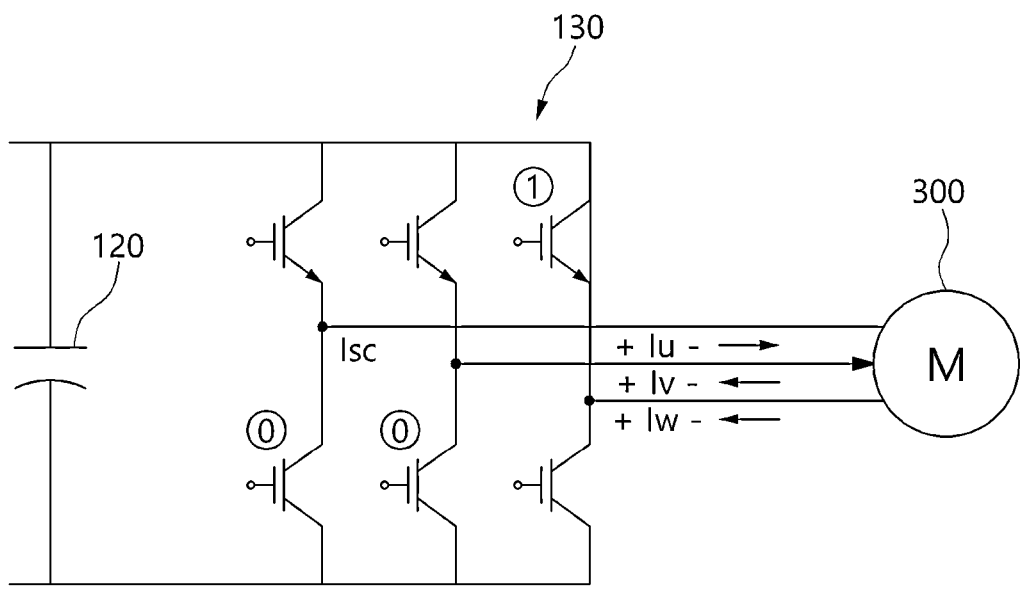
Figure 17:
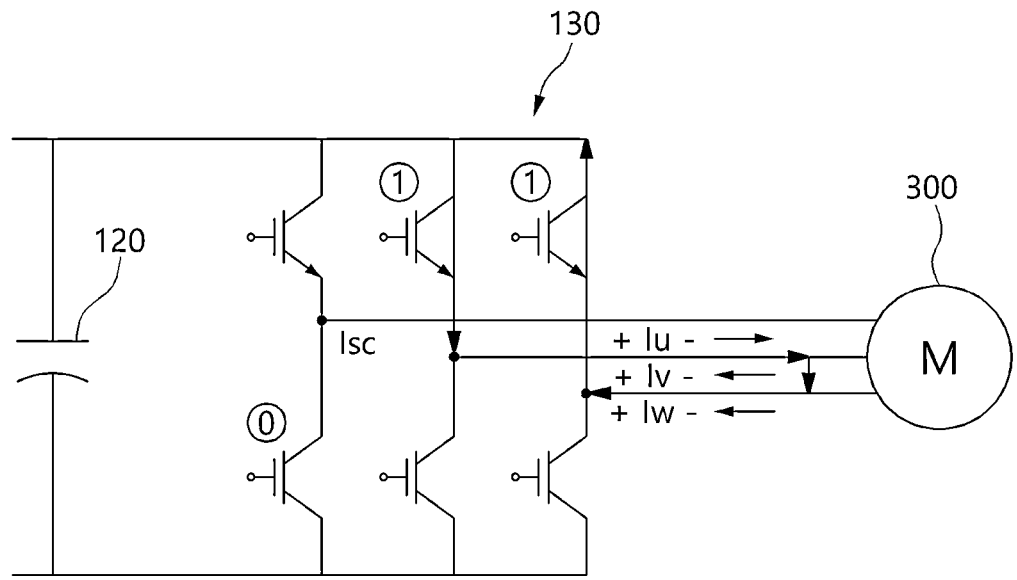
FIG. 17 is an exemplary diagram showing a current path in the case of an output short circuit of V-W phases in sector 4.
Figure 17:
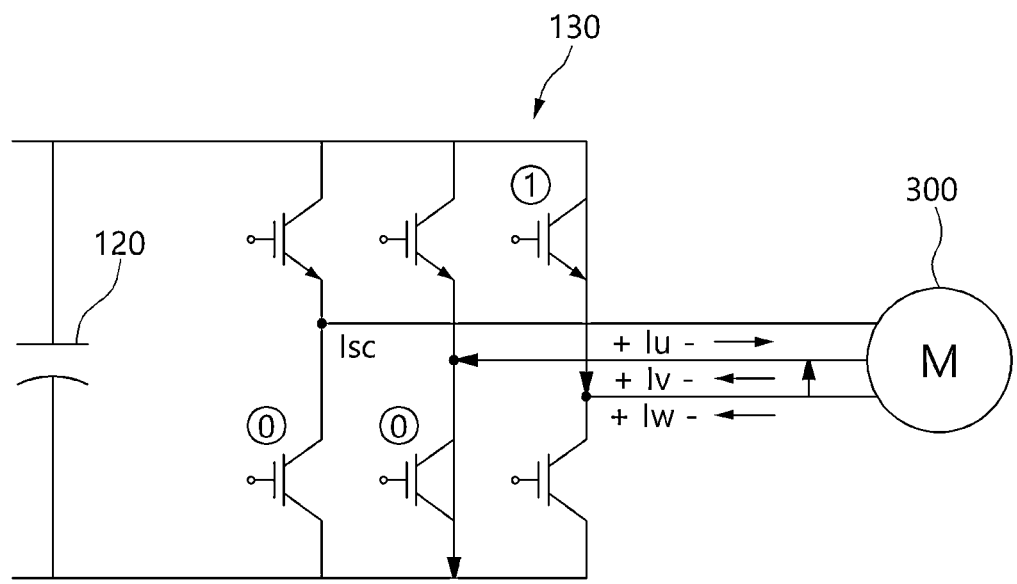
Figure 18:
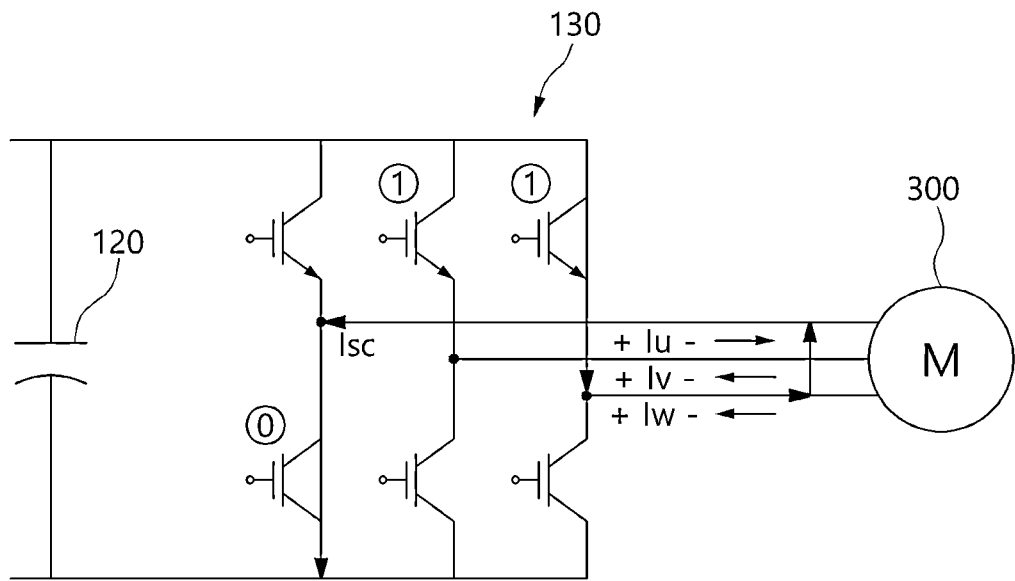
FIG. 18 is an exemplary diagram showing a current path in the case of an output short circuit of W-U phases in sector 4.
Figure 18:
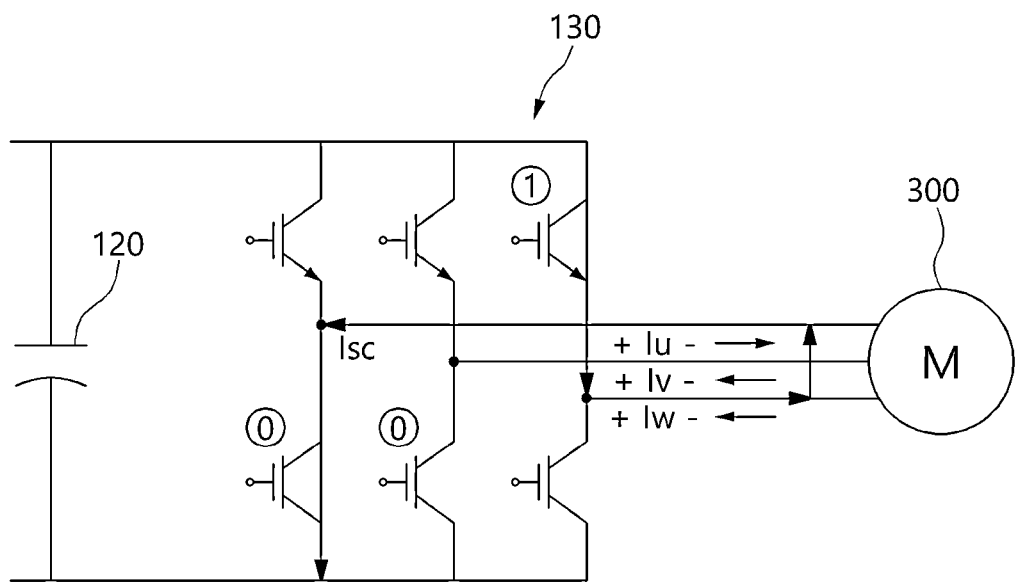

FIG. 16 is an exemplary diagram for describing a current path when the outputs of a U phase and a V phase are short-circuited in sector 4, FIG. 17 is an exemplary diagram for describing a current path when the outputs of a V phase and a W phase are short-circuited in sector 4, and FIG. 18 is an exemplary diagram for describing a current path when the outputs of a W phase and a U phase are short-circuited in sector 4.

As illustrated in FIG. 16, when the outputs of the U phase and the V phase are short-circuited in sector 4 (5D), a short-circuit current flows in the effective vector [0 1 1] (refer to (a)), and no short-circuit current flows in the effective vector [0 0 1] (refer to (b)).

As illustrated in FIG. 17, when the outputs of the V phase and the W phase are short-circuited in sector 4 (5D), since there is no potential difference in the effective vector [0 1 1], a short-circuit current does not flow (refer to (a)), and a short-circuit current flows in the effective vector [0 0 1] (refer to (b)).

In addition, as illustrated in FIG. 18, when the outputs of the W phase and the U phase are short-circuited in sector 4 (5D), a short-circuit current flows in the effective vector [0 1 1] (refer to (a)), and a short-circuit current also flows in the effective vector [0 0 1] (refer to (b)).

In sector 5 (5E) of FIG. 5, effective vectors are [0 0 1] and [1 0 1].

Figure 19:
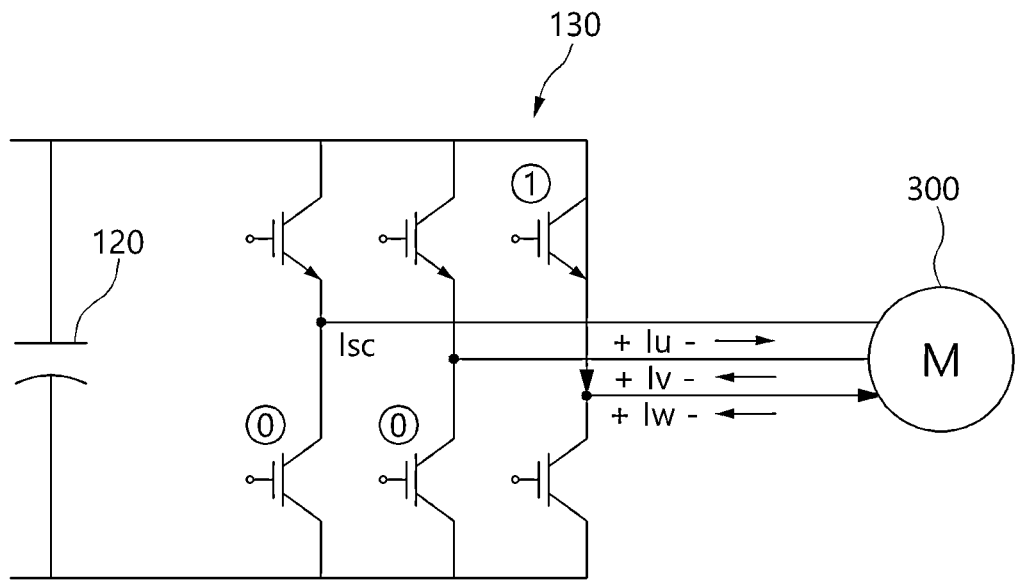
FIG. 19 is an exemplary diagram showing a current path in the case of an output short circuit of U-V phases in sector 5.
Figure 19:
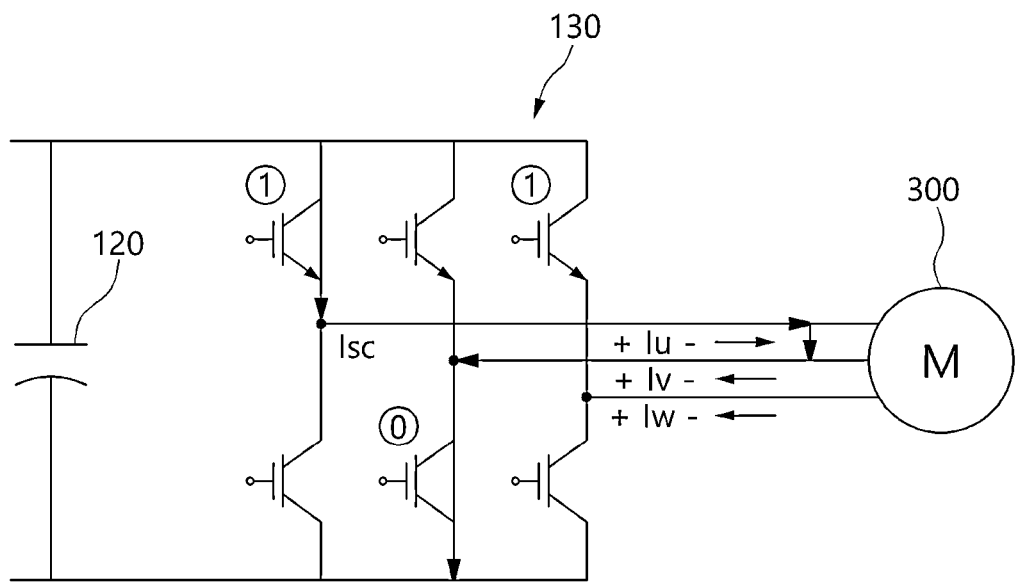
Figure 20:
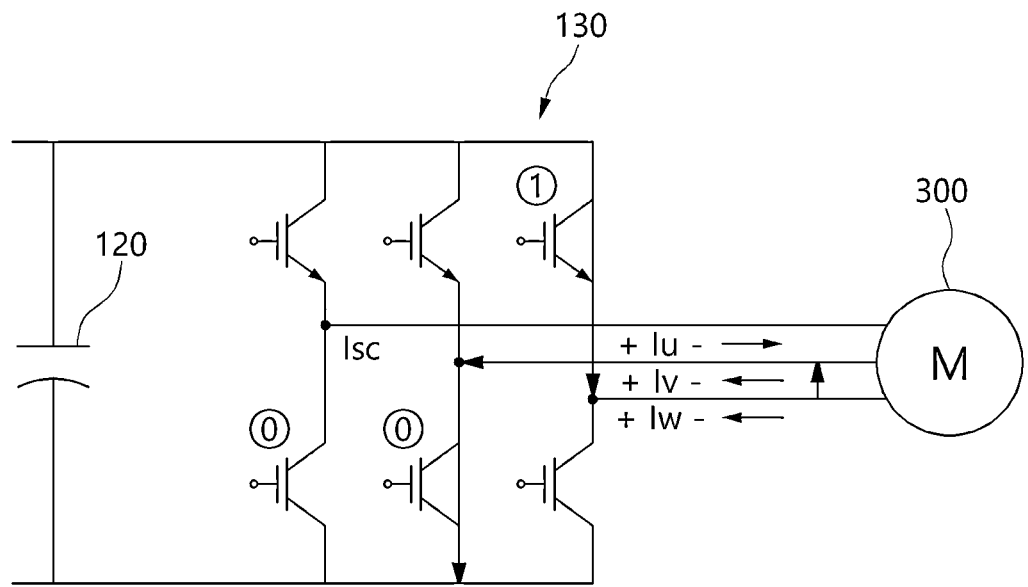
FIG. 20 is an exemplary diagram showing a current path in the case of an output short circuit of V-W phases in sector 5.
Figure 20:
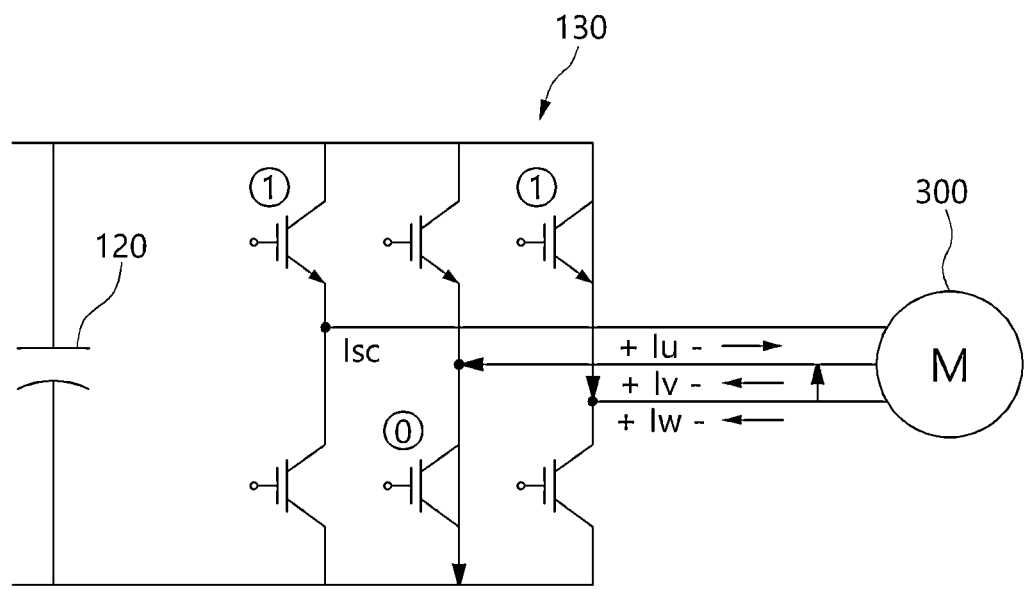
Figure 21:
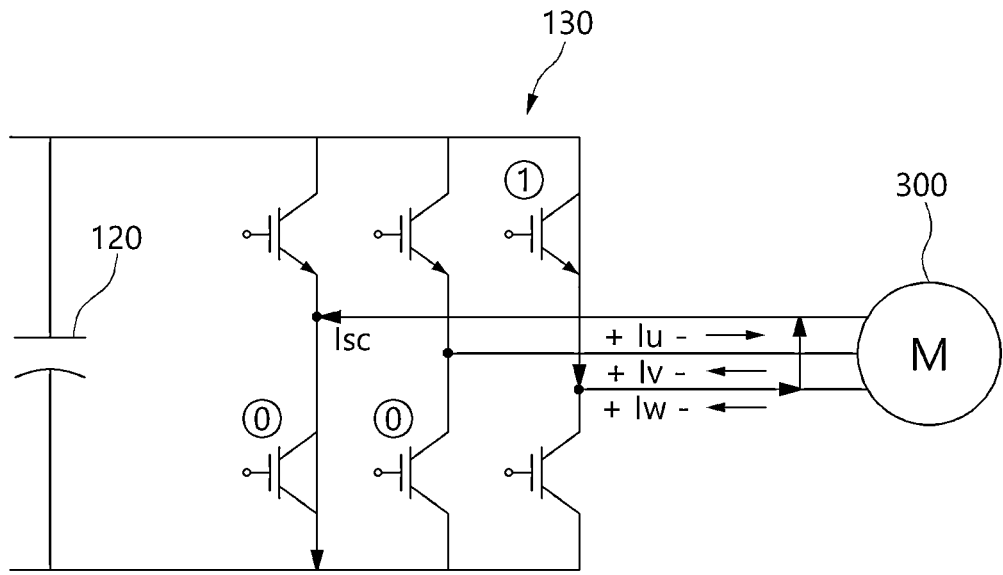
FIG. 21 is an exemplary diagram showing a current path in the case of an output short circuit of W-U phases in sector 5.
Figure 21:
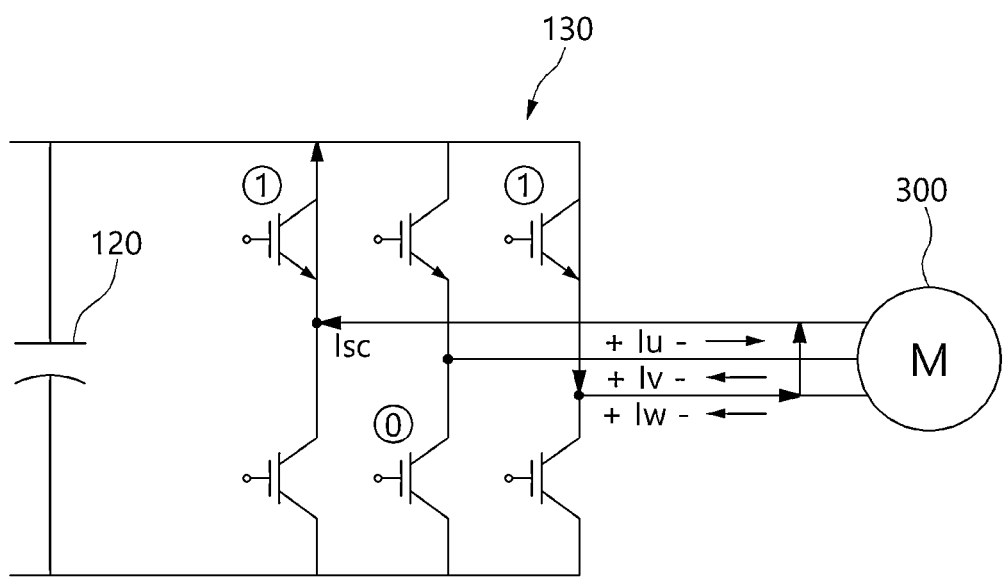

FIG. 19 is an exemplary diagram for describing a current path when the outputs of a U phase and a V phase are short-circuited in sector 5, FIG. 20 is an exemplary diagram for describing a current path when the outputs of a V phase and a W phase are short-circuited in sector 5, and FIG. 21 is an exemplary diagram for describing a current path when the outputs of a W phase and a U phase are short-circuited in sector 5.

As illustrated in FIG. 19, when the outputs of the U phase and the V phase are short-circuited in sector 5 (5E), a short-circuit current does not flow in the effective vector [0 0 1] (refer to (a)), and a short-circuit current flows in the effective vector [1 0 1] (refer to (b)).

As illustrated in FIG. 20, when the outputs of the V phase and the W phase are short-circuited in sector 5 (5E), a short-circuit current flows in the effective vector [0 0 1] (refer to (a)), and a short-circuit current also flows in the effective vector [1 0 1] (refer to (b)).

In addition, as illustrated in FIG. 21, when the outputs of the W phase and the U phase are short-circuited in sector 5 (5E), a short-circuit current flows in the effective vector [0 0 1] (refer to (a)), and since there is no potential difference in the effective vector [1 0 1], no short-circuit current flows (refer to (b)).

In sector 6 (5F) of FIG. 5, effective vectors are [1 0 1] and [1 0 0].

Figure 22:
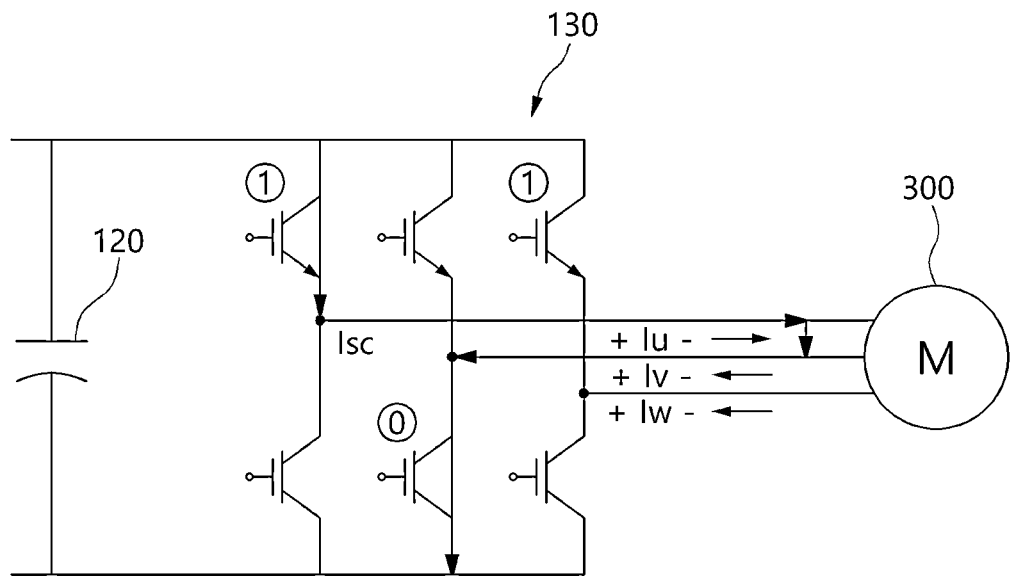
FIG. 22 is an exemplary diagram showing a current path in the case of an output short circuit of U-V phases in sector 6.
Figure 22:
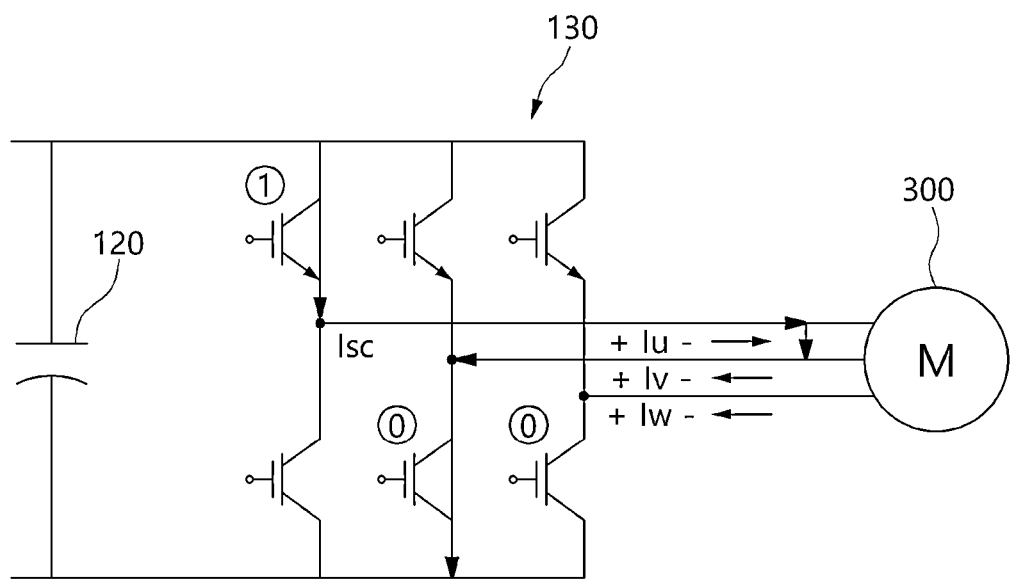
Figure 23:
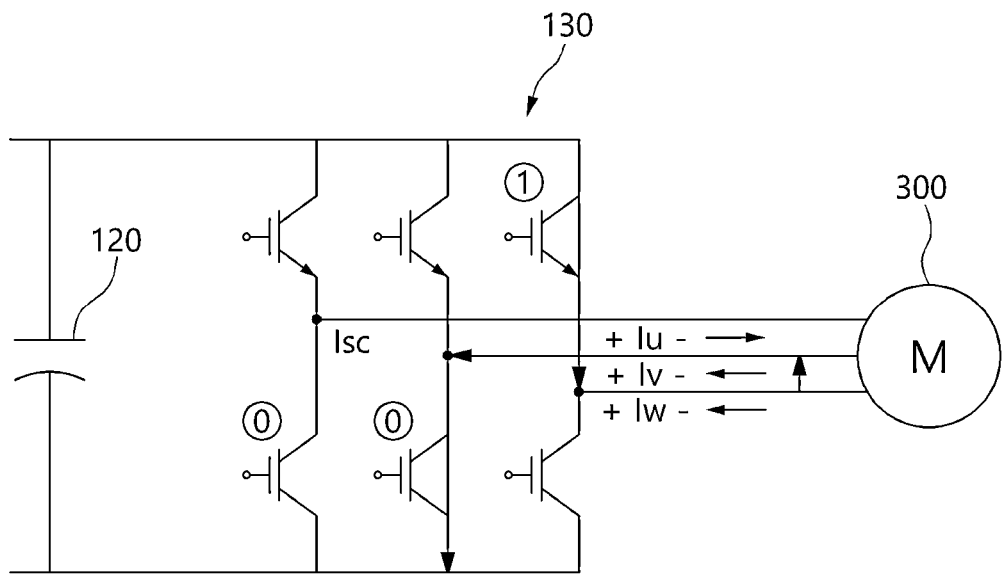
FIG. 23 is an exemplary diagram showing a current path in the case of an output short circuit of V-W phases in sector 6.
Figure 23:
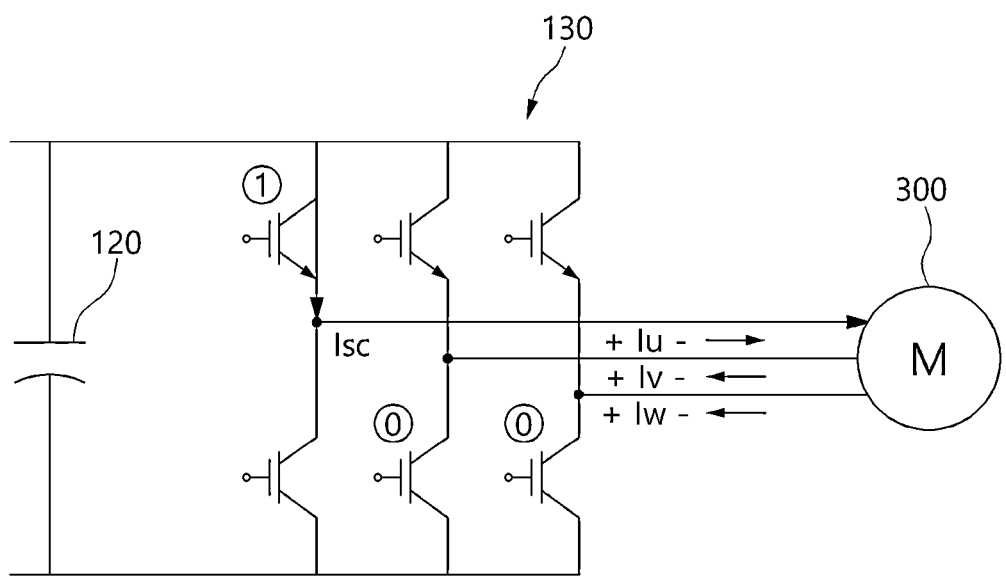
Figure 24:
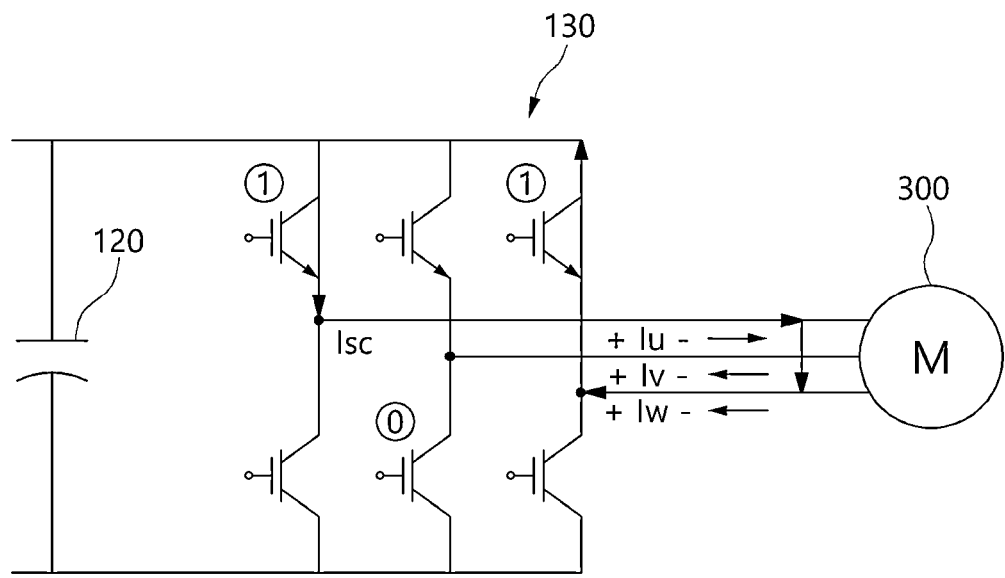
FIG. 24 is an exemplary diagram showing a current path in the case of an output short circuit of W-U phases in sector 6.
Figure 24:
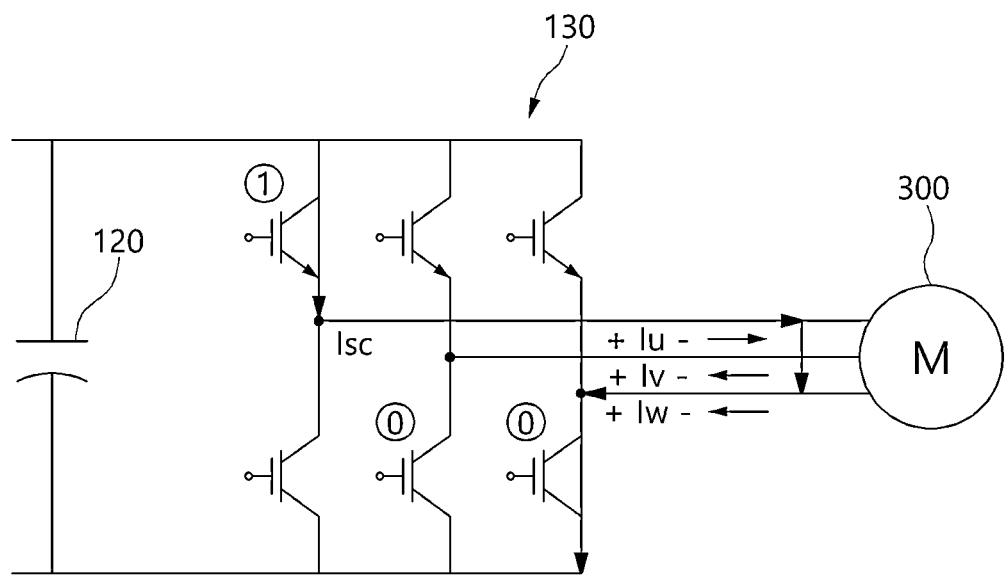

FIG. 22 is an exemplary diagram for describing a current path when the outputs of a U phase and a V phase are short-circuited in sector 6, FIG. 23 is an exemplary diagram for describing a current path when the outputs of a V phase and a W phase are short-circuited in sector 6, and FIG. 24 is an exemplary diagram for describing a current path when the outputs of a W phase and a U phase are short-circuited in sector 6.

As illustrated in FIG. 22, when the outputs of the U phase and the V phase are short-circuited in sector 6 (5F), a short-circuit current flows in both of the effective vectors [1 0 1] and [1 0 0] (refer to (a) and (b)).

As illustrated in FIG. 23, when the outputs of the V phase and the W phase are short-circuited in sector 6 (5F), a short-circuit current flows in the effective vector [1 0 1] (refer to (a)), and no short-circuit current flows in the effective vector [1 0 0] (refer to (b)).

In addition, as illustrated in FIG. 24, when the outputs of the W phase and the U phase are short-circuited in sector 6 (5F), since there is no potential difference in the effective vector [1 0 1], no short-circuit current flows (refer to (a)), and a short-circuit current flows in the effective vector [1 0 0] (refer to (b)).

As such, when the U phase and the V phase are short-circuited, a short-circuit current flows in the effective vectors [1 0 0], [0 1 0], [0 1 1] and [1 0 1]. In addition, when the V phase and the W phase are short-circuited, a short-circuit current flows in the effective vectors [1 1 0], [0 1 0], [0 0 1] and [1 0 1]. In addition, when the W phase and the V phase are short-circuited, a short-circuit current flows in the effective vectors [1 0 0], [1 1 0], [0 1 1] and [0 0 1].

According to the conventional short circuit detection method, when a short circuit occurs, the inverter is protected and the operator is protected by detecting a short circuit current flowing from the effective vector to block the output of the inverter and notifying the occurrence of a fault.

That is, in the conventional inverter output short-circuit detection method, when a short circuit occurs, a current path is formed in a section to which an effective vector is applied such that a short circuit current may be detected in the short-circuit detection circuit. However, since there is a hardware delay time in the short circuit detection circuit, cases may occur in which the short-circuit current cannot be accurately detected due to the delay time.

Figure 25:
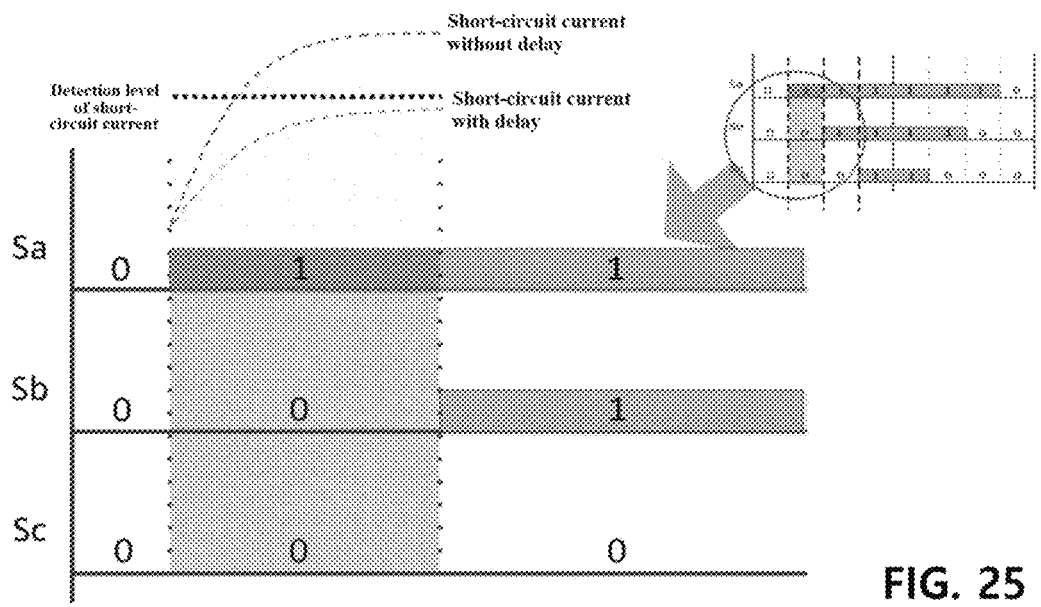
FIG. 25 is an exemplary diagram for describing that the detection of a short-circuit becomes impossible when an effective vector [1 0 0] section is formed to be short.

FIG. 25 is an exemplary diagram for describing that short-circuit detection becomes impossible when an effective vector [1 0 0] section is formed to be short. In the inverter low-speed operation section where the effective vector [1 0 0] section is formed to be short due to a circuit delay time present in the short circuit detection circuit, the magnitude of an effective vector becomes the same as the short-circuit creation time, and there is a problem in that as the magnitude of an effective vector decreases, the detection becomes impossible due to a delay in the short-circuit detection circuit.

Figure 26:
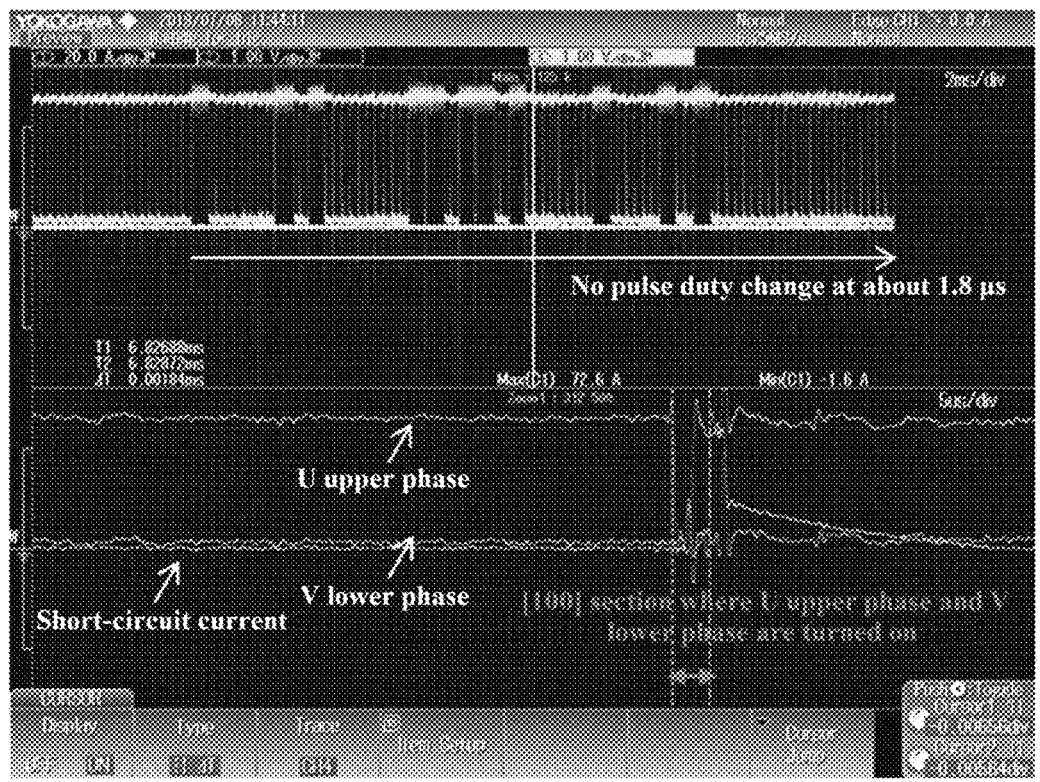
FIG. 26 is an exemplary diagram for describing a section in which the detection of short-circuit current becomes impossible when an output short circuit of U-V phases occurs.

FIG. 26 is an exemplary diagram for describing a section in which the detection of a short-circuit current is impossible when the U-V phase output short circuit occurs while the magnitude of an effective vector is formed to be small (1.8 ρs) due to the low-speed operation of the inverter.

As described above, since the conventional short-circuit current detection circuit has a limitation in the time detectable by hardware, it is impossible to detect a short-time short-circuit current, and when this impossible section is repeatedly and continuously continued, there is a problem in that the instantaneous short-circuit current continuously accumulates in the inverter, leading to burnout of the inverter.

The present disclosure is to solve such a problem, and by diagnosing a short circuit before starting the operation of the inverter, the output short circuit of the inverter is detected in advance to prevent damage to the inverter.

Figure 27:
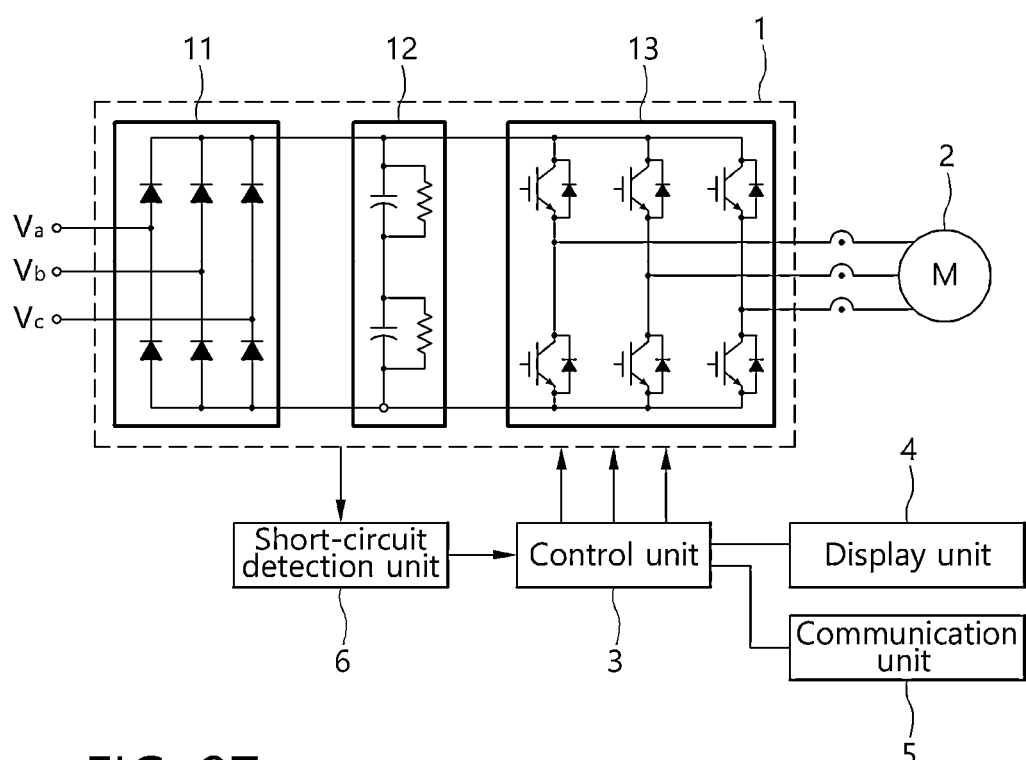
FIG. 27 is a configuration diagram of the inverter system according to an exemplary embodiment of the present disclosure.

FIG. 27 is a block diagram of the inverter system according to an exemplary embodiment of the present disclosure.

As illustrated in the drawing, the inverter system according to an exemplary embodiment of the present disclosure may include an inverter 1, an electric motor 2 operated by the output of the inverter 1 and a control unit 3 for controlling the inverter 1. In addition, the system according to an exemplary embodiment of the present disclosure may further include a display unit 4 and a communication unit 5. In addition, the system according to an exemplary embodiment of the present disclosure may further include a short-circuit detection unit 6.

The inverter 1 may include a rectifying unit 11 for rectifying the input three-phase power, a smoothing unit 12 for smoothing a DC voltage rectified by the rectifying unit 11 and an inverter 13 that converts the DC voltage stored in the smoothing unit 12 into a three-phase AC voltage under the control of the control unit 3.

The inverter unit 13 may be composed of a plurality of switching elements arranged in a predetermined topology, and single-phase AC voltages output from three legs may be output to the electric motor 2, respectively.

The control unit 3 may output a pulse width modulation (PWM) control signal to the inverter unit 13 so as to convert the DC voltage stored in the smoothing unit 12 into an AC voltage according to a predetermined command voltage.

In the stopped state of the inverter 1, since the PWM control signal of the control unit 3 is not applied, even if a short circuit is formed, it appears normal because a short circuit path is not formed. However, when a PWM control signal is applied from the control unit 3 to the inverter 1 according to an operation command, a short-circuit path is formed and a short-circuit current flows, causing damage to the inverter 1.

Therefore, when the inverter 1 receives an operation command, the control unit 3 of the present disclosure may diagnose in advance by applying a diagnostic PWM control signal for diagnosing a short circuit before applying an operational PWM control signal to the inverter unit 13, and when a short circuit is detected, the output of the inverter 1 may be blocked and the fault information may be notified to an upper control system (not illustrated) through the communication unit 5, or information indicating that a fault has occurred may be visually displayed on the display unit 4 such that the operator may confirm the information.

In addition, when a short circuit is not detected, the control unit 3 may apply a normal PWM control signal to the inverter unit 13 of the inverter 1 to start a normal operation.

In this case, the short-circuit detection unit 6 may detect a short-circuit current flowing through the lower leg of the inverter unit 13 and provide whether the detection is made to the control unit 3. The short-circuit detection unit 6 may include, for example, a current transformer CT, but the present disclosure is not limited thereto.

Figure 28:
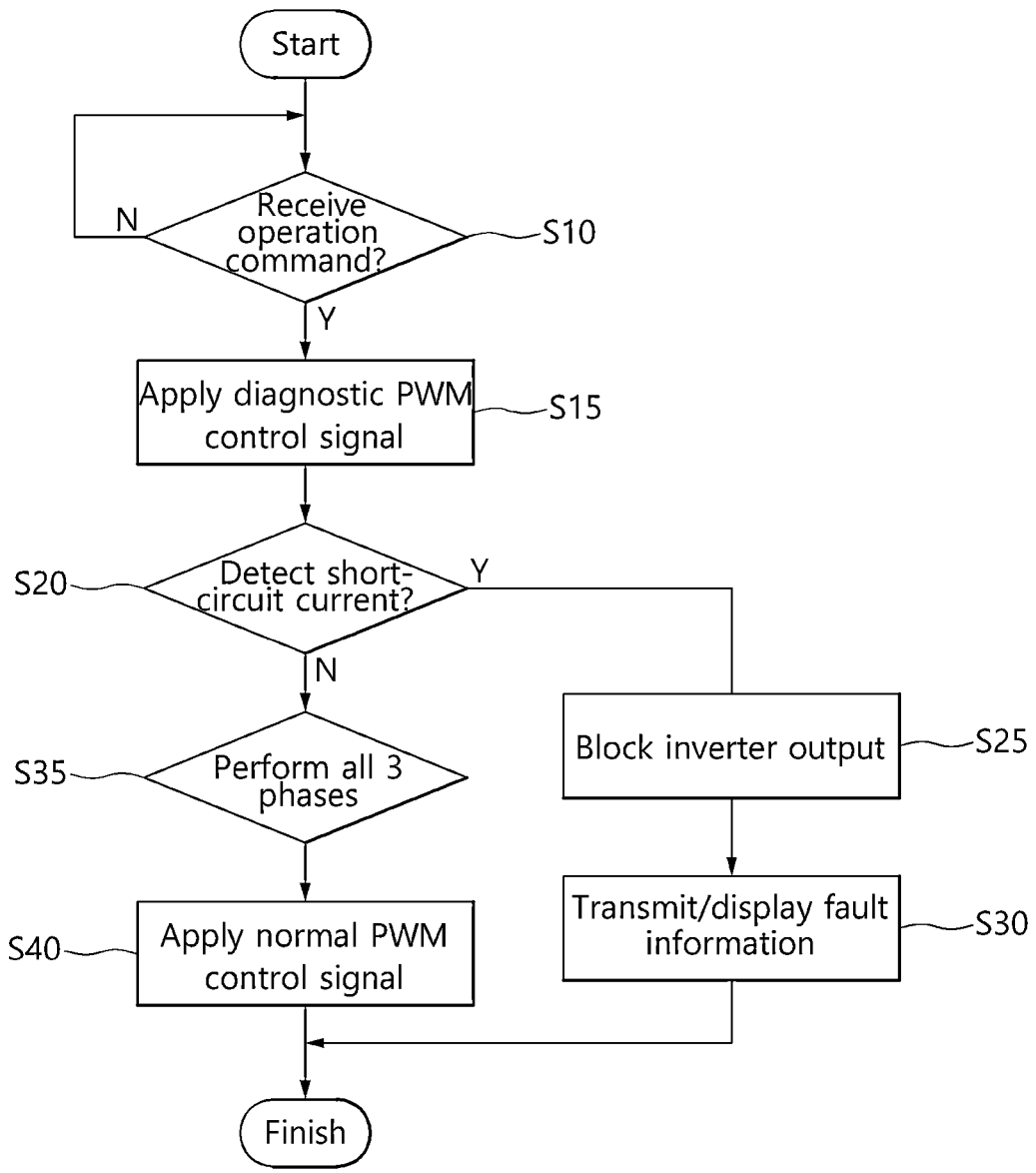
FIG. 28 is an exemplary diagram for describing the control method according to an exemplary embodiment of the present disclosure.

FIG. 28 is an exemplary diagram for describing the control method according to an exemplary embodiment of the present disclosure.

As illustrated in the drawing, the control unit 3 according to an exemplary embodiment of the present disclosure does not operate before an operation command is received, and when the operation command is received (S10), the control unit 3 may apply a diagnostic PWM control signal before the normal PWM control signal is applied (S15).

The diagnostic PWM control signal may be a PWM control signal that causes the inverter unit 13 to output any one of effective vectors [1 0 0], [0 1 0], [0 1 1] and [1 0 1] in response to a short circuit in the U-V phases, may be a signal that causes the inverter unit 13 to output any one or more of the effective vectors [1 1 0], [0 1 0], [0 0 1] and [1 0 1] in response to a short circuit in the V-W phases, and may be a signal for outputting any one or more of the effective vectors [1 0 0], [1 1 0], [0 1 1] and [0 0 1] in response to a short circuit in the W-U phases.

Figure 29:
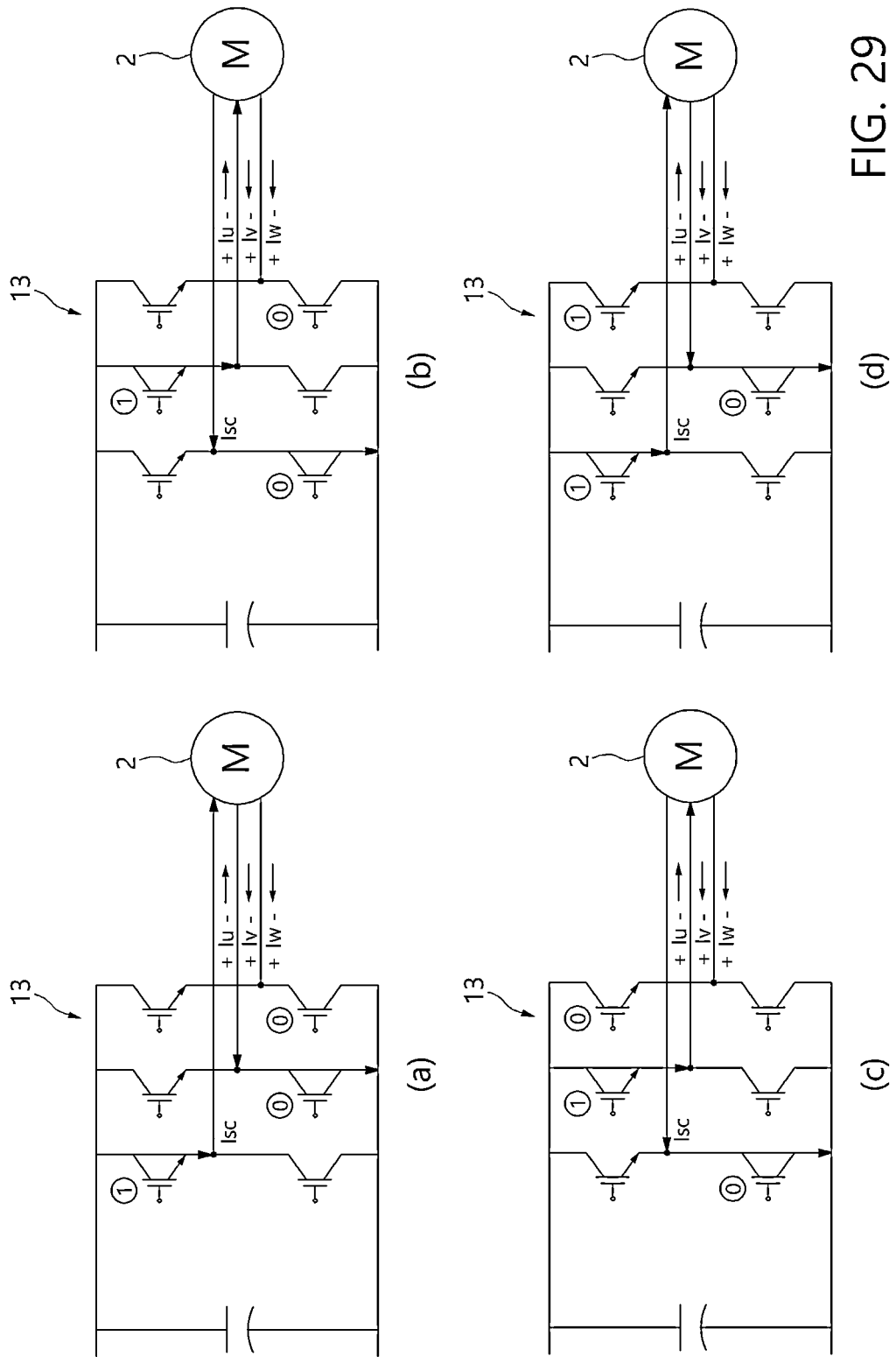
FIG. 29 shows a case in which a short-circuit current flows by each effective vector when U-V phases are short-circuited.

First, the control unit 3 applies a PWM control signal that causes the inverter unit 13 to output any one of the effective vectors [1 0 0], [0 1 0], [0 1 1] and [1 0 1] to determine whether the U phase and V phase are short-circuited. FIG. 29 shows a case in which a short-circuit current flows by each effective vector when the U-V phases are short-circuited.

That is, when the short-circuit detection unit 6 detects a current flowing to the lower leg of the inverter unit 13 as shown in FIG. 29 by applying a PWM control signal for allowing the control unit 3 to output one of the above effective vectors (S20), the control unit 3 may check the U-V phase short-circuit, block the output of the inverter 1 (S25), transmit the fault information to the upper control system through the communication unit 5, and display the fault information on the display unit 4 (S30). In this case, the output time of the effective vector may be set equal to or longer than the design time for detecting a short-circuit current in consideration of the circuit delay of the short-circuit detection unit 6. The design time for detecting a short-circuit current may vary depending on the circuit configuration of the short-circuit detection unit 6, and is not limited to any one value.

Such a diagnostic PWM control signal may be performed for all of the U-V phases, V-W phases and W-U phases (S35).

Figure 30:
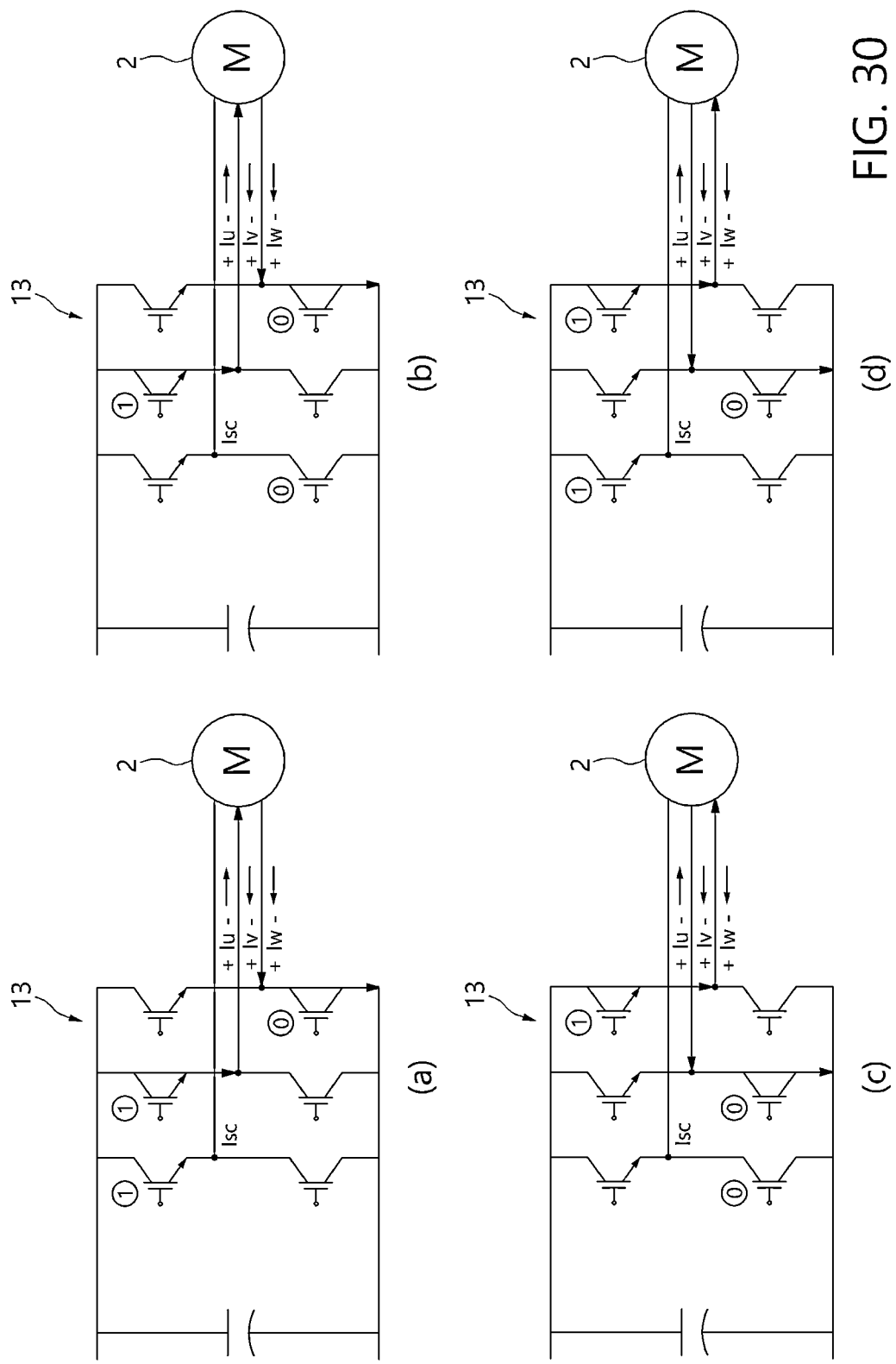
FIG. 30 shows a case in which a short-circuit current flows by each effective vector when V-W phases are short-circuited.

That is, the control unit 3 may apply a PWM control signal that causes the inverter unit 13 to output any one of the effective vectors [1 1 0], [0 1 0], [0 0 1] and [1 0 1] to determine whether the V phase and the W phase are short-circuited. FIG. 30 shows a case in which a short-circuit current flows by each effective vector when the V-W phases are short-circuited.

When the short-circuit detection unit 6 detects a current flowing into the lower leg of the inverter unit 13 as shown in FIG. 30 by applying a PWM control signal that causes the control unit 3 to output one of the above effective vectors (S20), the control unit (3) may check the U-V phase short circuit, block the output of the inverter 1 (S25), transmit the fault information to the upper control system through the communication unit 5, and display the fault information on the display unit 4 (S30).

Figure 31:
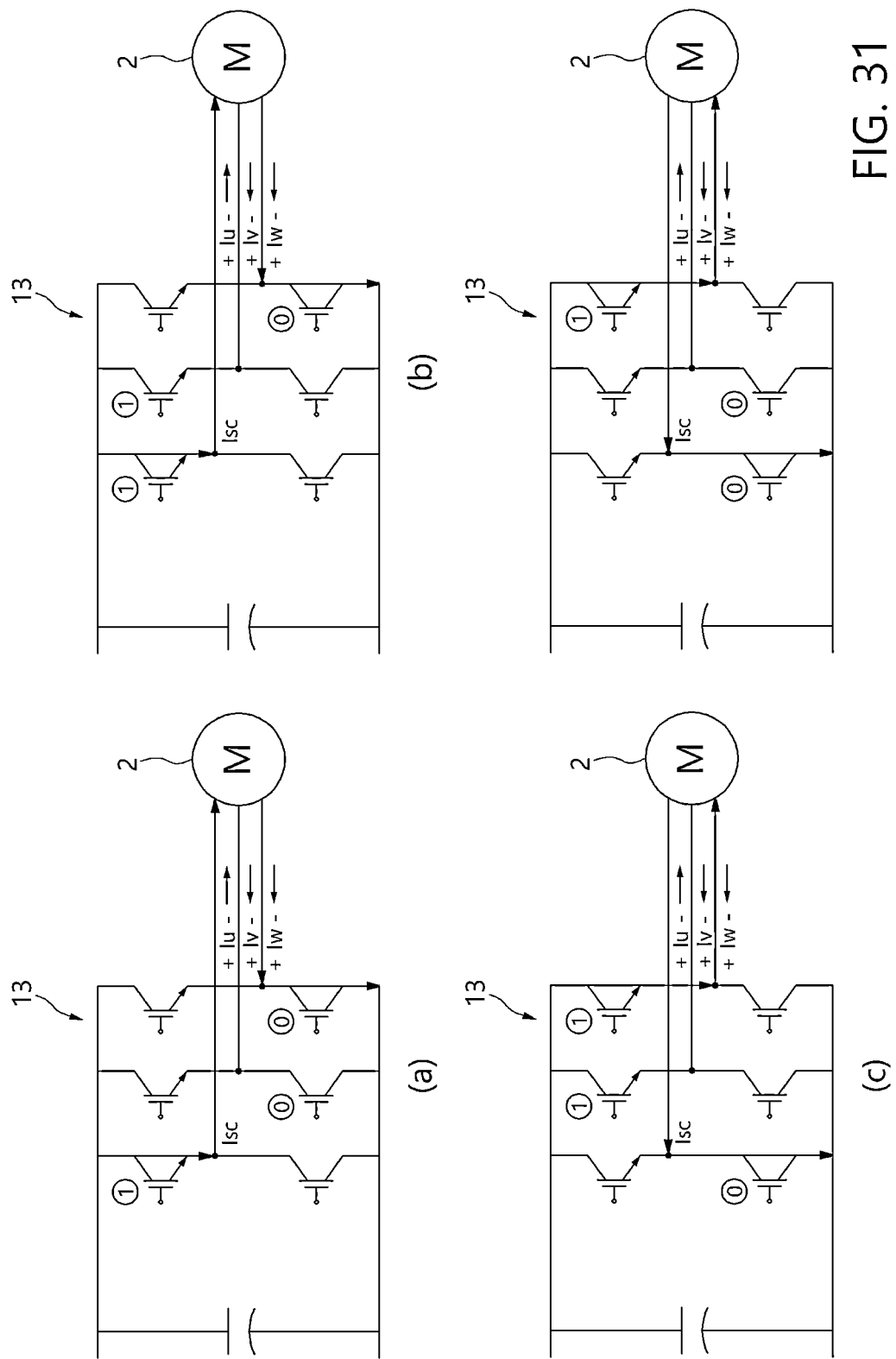
FIG. 31 shows a case in which a short-circuit current flows by each effective vector when W-U phases are short-circuited.

In addition, the control unit 3 may apply a PWM control signal to output any one of the effective vectors [1 0 0], [1 1 0], [0 1 1] and [0 0 1] to determine whether the W phase and the U phase are short-circuited. FIG. 31 shows a case in which a short-circuit current flows by each effective vector when the W-U phases are short-circuited.

When the short-circuit detection unit 6 detects a current flowing into the lower leg of the inverter unit 13 as shown in FIG. 31 by applying a PWM control signal that causes the control unit 3 to output one of the above effective vectors (S20), the control unit (3) may check the U-V phase short circuit, block the output of the inverter 1 (S25), transmit the fault information to the upper control system through the communication unit 5, and display the fault information on the display unit 4 (S30).

Meanwhile, when the short-circuit current does not flow as shown in FIGS. 29 to 31, the control unit 3 may apply a normal PWM control signal to the inverter unit 13 of the inverter 1 to start a normal operation (S40).

As described above, according to an exemplary embodiment of the present disclosure, when an operation command is received by the inverter 1 when a short circuit occurs, the control unit 3 performs short-circuit diagnosis by a diagnostic PWM control signal in advance to block the output of the inverter in advance, thereby protecting the inverter and protecting the operator. The diagnostic PWM control signal is output when a short circuit does not occur, but since a large current does not flow in a short diagnostic PWM section due to the impedance of the electric motor 2, there is less possibility of a false diagnosis.

Although the exemplary embodiments according to the present disclosure have been described above, these are merely exemplary, and those of ordinary skill in the art will understand that various modifications and equivalent ranges of exemplary embodiments are possible therefrom. Accordingly, the true technical protection scope of the present disclosure should be defined by the following claims.

The invention claimed is:

1. A control apparatus for controlling an inverter, comprising:
   an inverter unit composed of a plurality of switching elements to convert a DC voltage into an AC voltage under the control of a control unit and output the AC voltage;
   a short-circuit detection unit for detecting a short-circuit current flowing through the inverter unit; and
   the control unit for applying a pulse width modulation (PWM) control signal to the inverter unit such that the inverter unit outputs at least one of a plurality of effective vectors for diagnosing a short circuit in an output of the inverter,
   the control unit is configured to set an output time of at least one of the plurality of effective vectors to be longer than a designed time for the short-circuit detection unit to detect the short-circuit based on a circuit delay of the short-circuit detection unit.

2. The control apparatus of claim 1, wherein the inverter unit is composed of a three-phase leg that outputs a three-phase AC voltage, and
   wherein the short-circuit detection unit detects a short-circuit current flowing to a lower leg of the three-phase leg.

3. The control apparatus of claim 1, wherein the PWM control signal includes a signal that causes the inverter unit to output any one of [1 0 0], [0 1 0], [0 1 1] and [1 0 1], which are the effective vectors, in response to a short circuit of U-V phases.

4. The control apparatus of claim 1, wherein the PWM control signal includes a signal that causes the inverter unit to output any one or more of [1 1 0], [0 1 0], [0 0 1] and [1 0 1], which are the effective vectors, in response to a short circuit of V-W phases.

5. The control apparatus of claim 1, wherein the PWM control signal includes a signal that causes the inverter unit to output any one or more of [1 0 0], [1 1 0], [0 1 1] and [0 0 1], which are the effective vectors, in response to a short circuit of W-U phases.

6. A method for controlling an inverter comprising an inverter unit that is composed of a plurality of switching elements to convert a DC voltage into an AC voltage and output the AC voltage, the method comprising the steps of:
   receiving an operation command of the inverter;
   outputting a first PWM control signal to the inverter unit to output at least one of a plurality of effective vectors for diagnosing a short circuit in an output of the inverter; and
   blocking the output of the inverter when a short-circuit current of the inverter unit is detected by a short-circuit detection unit,
   prior to the step of outputting the first PWM control signal to the inverter unit, the method further comprising a step of setting an output time of at least one of the plurality of effective vectors to be longer than a designed time for the short-circuit detection unit to detect the short circuit current based on a circuit delay of the short-circuit detection unit.

7. The method of claim 6, wherein the PWM control signal includes a signal that causes the inverter unit to output any one of [1 0 0], [0 1 0], [0 1 1] and [1 0 1], which are the effective vectors, in response to a short circuit of U-V phases.

8. The method of claim 6, wherein the PWM control signal includes a signal that causes the inverter unit to output any one or more of [1 1 0], [0 1 0], [0 0 1] and [1 0 1], which are the effective vectors, in response to a short circuit of V-W phases.

9. The method of claim 6, wherein the PWM control signal includes a signal that causes the inverter unit to output any one or more of [1 0 0], [1 1 0], [0 1 1] and [0 0 1], which are the effective vectors, in response to a short circuit of W-U phases.

10. The method of claim 6, further comprising outputting a second PWM control signal for normal operation of the inverter, when a short-circuit current of the inverter unit is not detected.

* * * * *